US011658266B2

(12) United States Patent
Kang et al.

(10) Patent No.: US 11,658,266 B2
(45) Date of Patent: *May 23, 2023

(54) LIGHTING MODULE AND LIGHTING APPARATUS HAVING SAME

(71) Applicant: LG INNOTEK CO., LTD., Seoul (KR)

(72) Inventors: Se Eun Kang, Seoul (KR); Kwang Hyun Ko, Seoul (KR); Moo Ryong Park, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/887,550

(22) Filed: Aug. 15, 2022

(65) Prior Publication Data

US 2022/0393064 A1 Dec. 8, 2022

Related U.S. Application Data

(63) Continuation of application No. 17/489,099, filed on Sep. 29, 2021, now Pat. No. 11,450,786, which is a
(Continued)

(30) Foreign Application Priority Data

Nov. 14, 2017 (KR) .......................... 10-2017-0151373

(51) Int. Cl.
*H01L 33/10* (2010.01)
*F21K 9/00* (2016.01)
(Continued)

(52) U.S. Cl.
CPC ................ *H01L 33/10* (2013.01); *F21K 9/00* (2013.01); *H01L 33/54* (2013.01); *H01L 33/56* (2013.01); *H01L 33/58* (2013.01); *F21Y 2115/10* (2016.08)

(58) Field of Classification Search
CPC .......... H01L 33/10; H01L 33/54; H01L 33/56; H01L 33/58; F21K 9/00; F21Y 2115/10
See application file for complete search history.

(56) References Cited

U.S. PATENT DOCUMENTS

| 4,929,866 A | 5/1990 | Murata et al. |
| 9,929,328 B2 | 3/2018 | Park et al. |

(Continued)

FOREIGN PATENT DOCUMENTS

| CN | 101876407 | 11/2010 |
| CN | 102376853 | 3/2012 |

(Continued)

OTHER PUBLICATIONS

International Search Report dated Feb. 25, 2019 issued in Application No. PCT/KR2018/013485.
(Continued)

*Primary Examiner* — Mary Ellen Bowman
(74) *Attorney, Agent, or Firm* — KED & Associates LLP

(57) ABSTRACT

Lighting module disclosed in an embodiment of the invention, a substrate; a plurality of light emitting devices disposed on the substrate; a first reflective layer disposed on the substrate; a resin layer disposed on the first reflective layer and the light emitting device; and a second reflective layer disposed on the resin layer, wherein the resin layer is a front side surface on which light generated from the plurality of light emitting devices is emitted, a rear side surface facing the front side surface, and first and second side surfaces connecting the front side surface and the rear side surface with each other. A distance between the first reflective layer and the second reflective layer is smaller than a distance between the front side surface and the rear side surface of the resin layer, and the front side surface of the resin layer has a plurality of convex portions convex toward the front side surface from the light emitting device and a plurality of
(Continued)

concave portions recessed in a direction of the rear side surface.

20 Claims, 23 Drawing Sheets

Related U.S. Application Data continuation of application No. 16/760,659, filed as application No. PCT/KR2018/013485 on Nov. 7, 2018, now Pat. No. 11,164,993.

(51) Int. Cl.
*H01L 33/54* (2010.01)
*H01L 33/56* (2010.01)
*H01L 33/58* (2010.01)
*F21Y 115/10* (2016.01)

(56) References Cited

U.S. PATENT DOCUMENTS

| | | | |
|---|---|---|---|
| 11,450,786 B2* | 9/2022 | Kang | ............ H01L 33/56 |
| 2006/0285312 A1 | 12/2006 | Ogawa et al. | |
| 2007/0030676 A1 | 2/2007 | Ichihara | |
| 2007/0109792 A1 | 5/2007 | Chosa et al. | |
| 2011/0050558 A1 | 3/2011 | Park et al. | |
| 2014/0001506 A1 | 1/2014 | Park et al. | |
| 2014/0307470 A1 | 10/2014 | Horiuchi | |
| 2015/0062484 A1 | 3/2015 | Lee et al. | |
| 2015/0369997 A1 | 12/2015 | Ye et al. | |

FOREIGN PATENT DOCUMENTS

| | | |
|---|---|---|
| DE | 10-2011-002340 | 10/2012 |
| EP | 1 670 069 | 6/2006 |
| JP | 2004-235139 | 8/2004 |
| JP | 2007-042901 | 2/2007 |
| JP | 2011-233416 | 11/2011 |
| JP | 2014-011159 | 1/2014 |
| JP | 2014-206656 | 10/2014 |
| KR | 10-2005-0119045 | 12/2005 |
| KR | 10-2006-0063952 | 6/2006 |
| KR | 10-2011-0107631 | 10/2011 |
| KR | 10-1078033 | 10/2011 |
| KR | 10-2015-0025728 | 3/2015 |
| KR | 10-2015-0057881 | 5/2015 |
| KR | 10-2015-0062351 | 6/2015 |

OTHER PUBLICATIONS

European Search Report dated Nov. 24, 2020 issued in EP Application No. EP 18878404.5.
Korean Office Action dated May 12, 2022 issued in KR Application No. 10-2017-0151373.
Japanese Office Action dated Nov. 15, 2022 issued in JP Application No. 2020-526130.
Chinese Office Action dated Feb. 24, 2023 issued in Application No. 201880073847.9.

* cited by examiner

LIGHTING MODULE AND LIGHTING APPARATUS HAVING SAME

CROSS-REFERENCE TO RELATED APPLICATIONS

This application is a Continuation Application of U.S. patent application Ser. No. 17/489,099 filed Sep. 29, 2021, which is a Continuation Application of U.S. patent application Ser. No. 16/760,659 filed Apr. 30, 2020, which is a U.S. National Stage Application under 35 U.S.C. § 371 of PCT Application No. PCT/KR2018/013485, filed Nov. 7, 2018, which claims priority to Korean Patent Application No. 10-2017-0151373, filed Nov. 14, 2017, whose entire disclosures are hereby incorporated by reference.

BACKGROUND

1. Field

An embodiment of the invention relates to a lighting module having a plurality of light emitting devices.

An embodiment of the invention relates to a lighting module providing a surface light source having a line shape.

Embodiments relate to a lighting apparatus having a lighting module.

The embodiment relates to a light unit having a lighting module, a liquid crystal display, and a vehicle lamp.

2. Background

Conventional lighting applications include not only a vehicle lighting but also a backlight for a display and a signage.

A light emitting device, for example, a light emitting diode (LED) has advantages such as low power consumption, semi-permanent lifetime, fast response speed, safety, environmental friendliness compared to conventional light sources such as fluorescent lamps and incandescent lamps. Such an LED has been applied to various lighting devices such as various display devices, indoor lights or outdoor lights, or the like.

Recently, a lamp employing an LED has been proposed as a vehicle light source. Compared to incandescent lamps, an LED has an advantage in low power consumption. However, since an emitting angle of light emitted from an LED is small, when the LED is used as a vehicle lamp, it is required to increase a light-emitting area of a lamp using the LED.

Since a size of an LED is small, it is possible to increase a degree of freedom of design of a lamp, and the LED has economic efficiency due to the semi-permanent lifetime.

BRIEF DESCRIPTION OF THE DRAWINGS

The embodiments will be described in detail with reference to the following drawings in which like reference numerals refer to like elements wherein.

DETAILED DESCRIPTION

Figure 1:
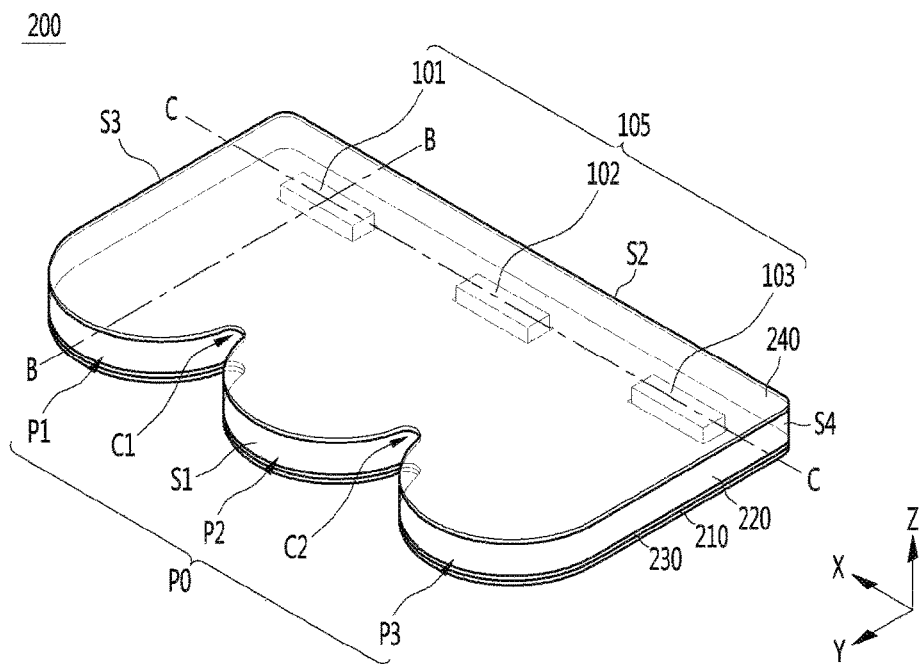
FIG. 1 is a perspective view showing a lighting module according to an embodiment of the invention.

Hereinafter, with reference to the accompanying drawings will be described in detail preferred embodiments that may be easily carried out by the person of ordinary skill in the art. However, it should be understood that the configurations shown in the embodiments and drawings described in this specification are only preferred embodiments of the invention, and that there may be various equivalents and modifications that can replace them at the time of application.

In the detailed description of the operating principle for the preferred embodiment of the invention, when it is determined that a detailed description of related known functions or configurations may unnecessarily obscure the subject matter of the invention, the detailed description will be omitted. Terms to be described later are terms defined in consideration of functions in the invention, and the meaning of each term should be interpreted based on the contents throughout the present specification. The same reference numerals are used for parts having similar functions and functions throughout the drawings.

The lighting device according to the invention may be applied to various lamp devices that require lighting, such as vehicle lamps, household lighting devices, and industrial lighting devices. For example, when applied to vehicle lamps, head lamps, car lights, side mirror lights, fog lights, tail lamps, brake lights, daytime running lights, vehicle interior lights, door scars, rear combination lamps, backup lamps It is applicable to back. The lighting device of the invention may be applied to indoor and outdoor advertising devices, display devices, and various electric vehicle fields.

In addition, it may be applied to all lighting-related fields or advertising-related fields that are currently developed and commercialized or may be implemented according to future technological development. Would say Hereinafter, the embodiments will be apparent through the description of the accompanying drawings and embodiments. In the description of the embodiments, each layer (film), region, pattern or structure is formed "on" or "under" of the substrate, each layer (film), region, pad or patterns. In the case described as, "on" and "under" include both "directly" or "indirectly" formed through another layer. In addition, the criteria for the top or bottom of each layer will be described based on the drawings.

<Lighting Module>

Figure 2:
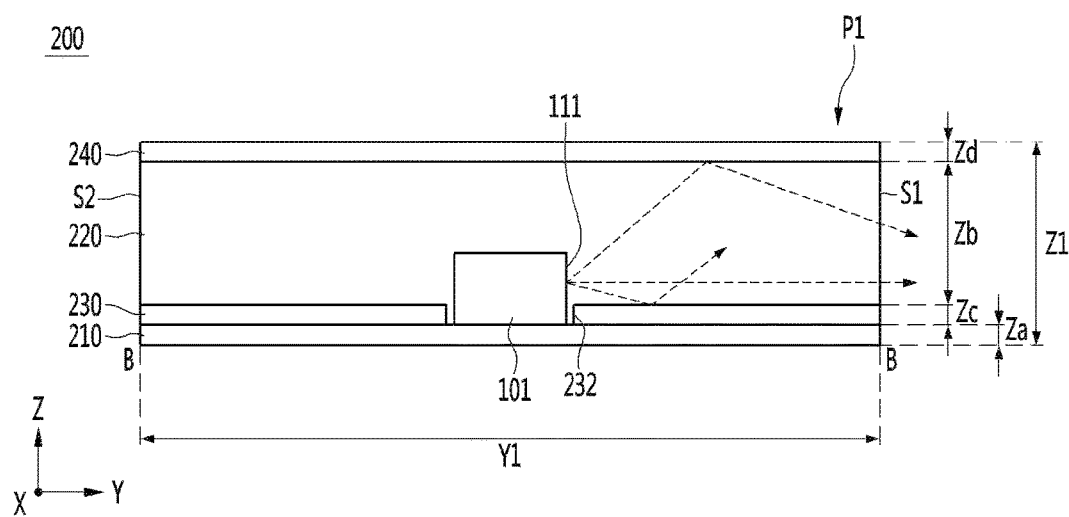
FIG. 2 is a cross-sectional view along the B-B side of the lighting module of FIG. 1.
Figure 3:
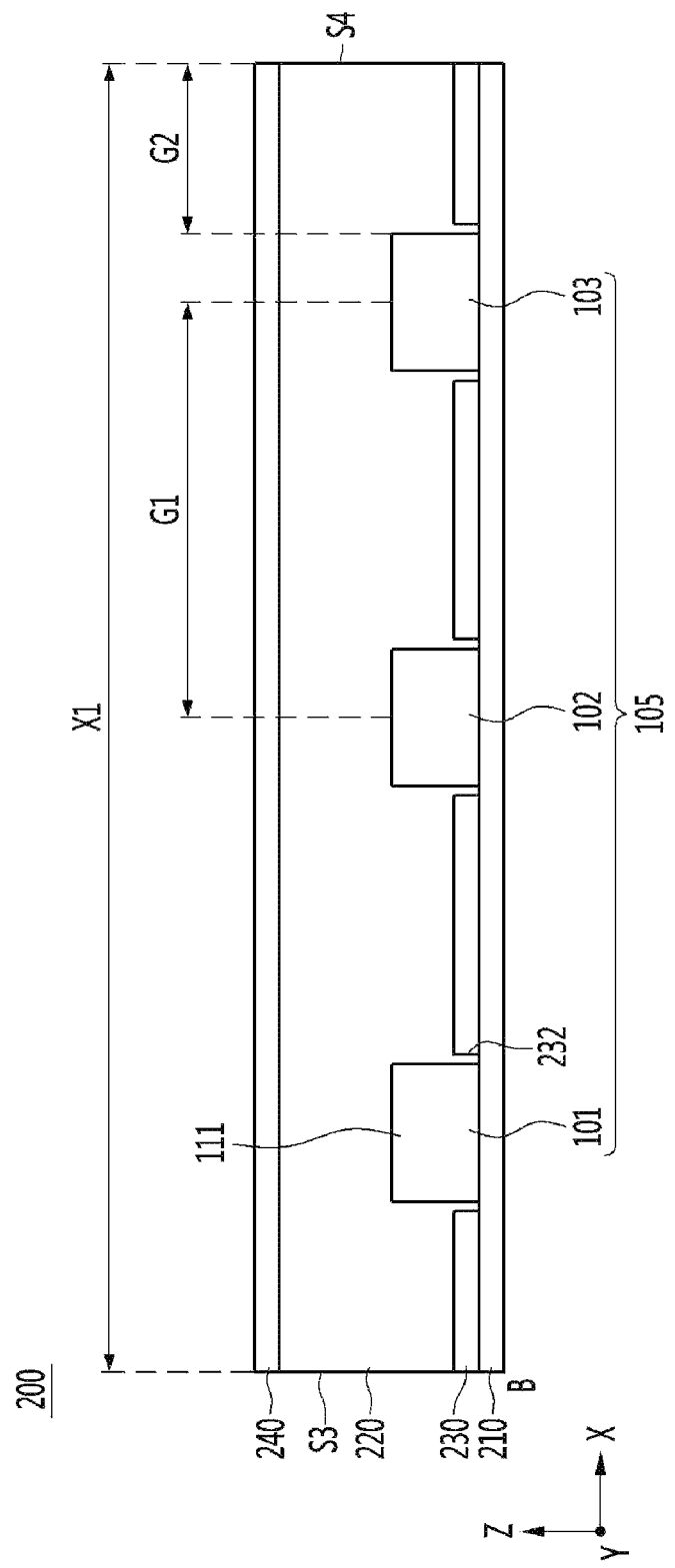
FIG. 3 is a cross-sectional view of the lighting module C-C of FIG. 1.
Figure 4:
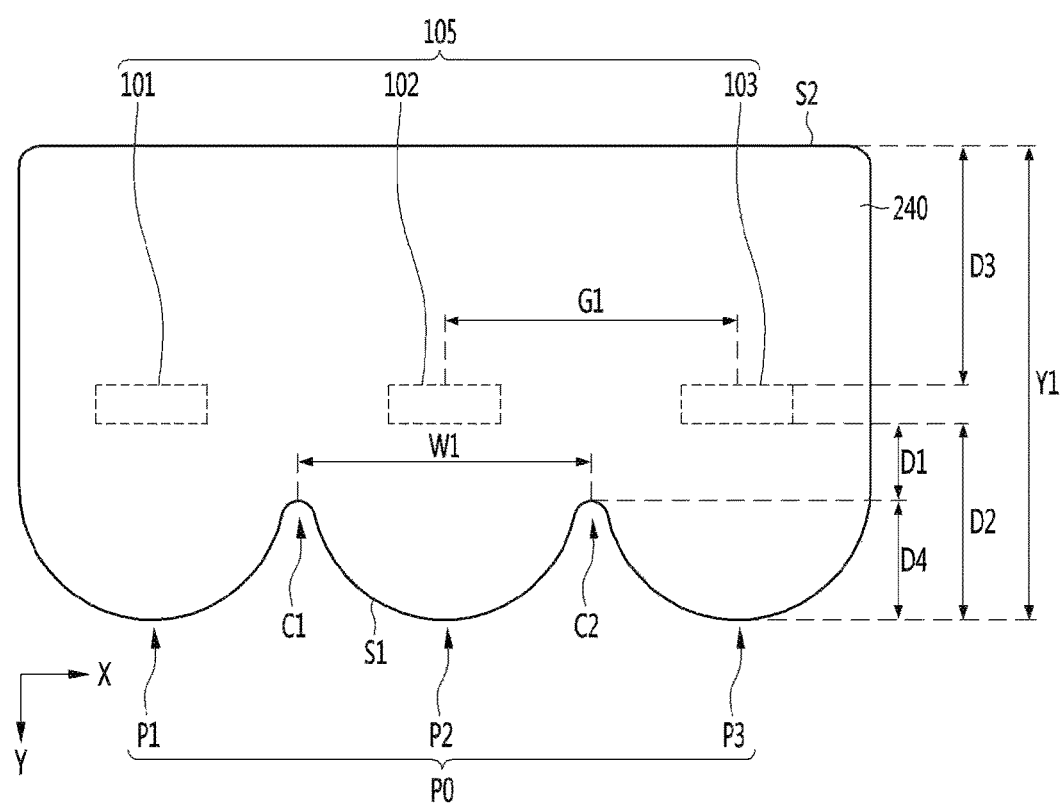
FIG. 4 is an example of a partial plan view of the lighting module of FIG. 1.
Figure 5:
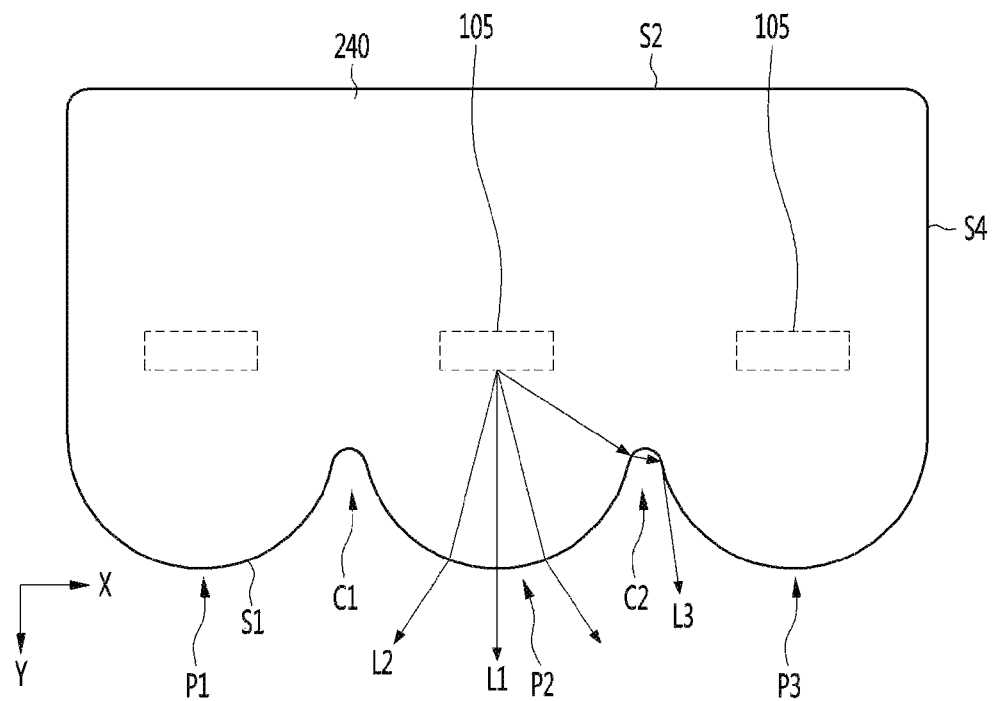
FIG. 5 is an example of light extraction of the lighting module of FIG. 1.
Figure 6:
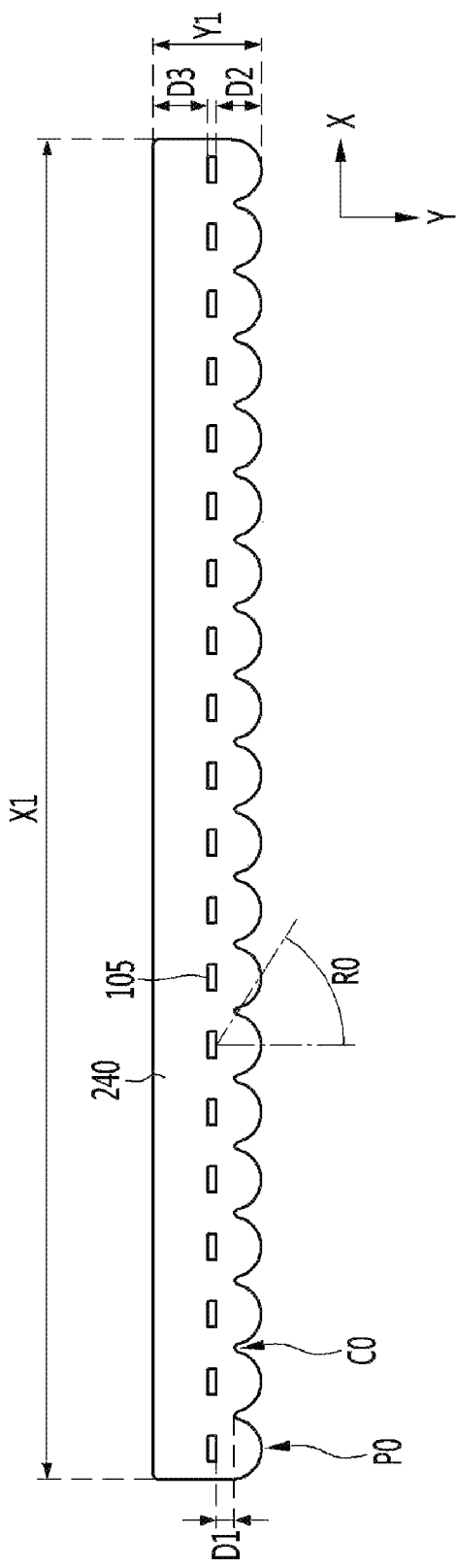
FIG. 6 is an example in which the length of the lighting module of FIG. 1 is modified.
Figure 7:
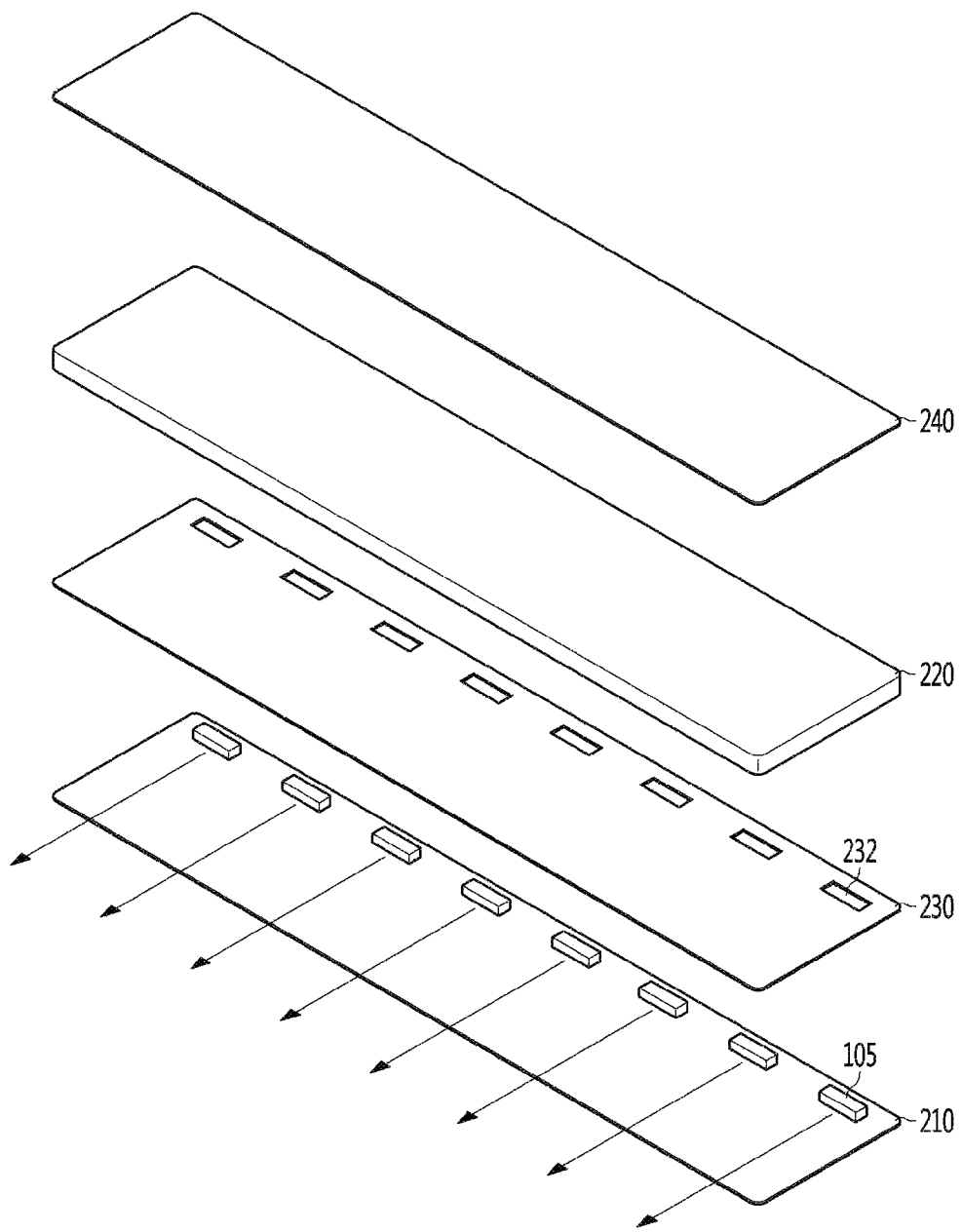
FIG. 7 is an exploded perspective view of the lighting module of FIG. 1.

FIG. 1 is a perspective view showing a lighting module according to an embodiment of the invention, FIG. 2 is a B-B side sectional view of the lighting module of FIG. 1, FIG. 3 is a C-C side sectional view of the lighting module of FIG. 1, and FIG. 4 is an example of a partial plan view of the lighting module of FIG. 1 FIG. 5 is an example of light extraction of the lighting module of FIG. 1, FIG. 6 is an example of modifying the length of the lighting module of FIG. 1, and FIG. 7 is an exploded perspective view of the lighting module of FIG.

FIGS. 1 to 6, a lighting module 200 according to an embodiment of the invention includes one or a plurality of light emitting devices 105, and may irradiate with the light emitted from the light emitting devices 105 to a surface light source having line shape. The light emitted from the light emitting device 105 may be emitted as a light source having a constant height in the vertical direction.

The lighting module 200 may include a substrate 210, a resin layer 220 disposed on the substrate 210, and a second reflective layer 240 disposed on the resin layer 220. The lighting module 200 may include a first reflective layer 230 between the substrate 210 and the resin layer 220.

As shown in FIGS. 2 and 3, the lighting module 200 may have a length X1 in the first direction X greater than a width Y1 in the second direction Y. The lengths of the first and second directions X and Y may be greater than the thickness Z1 or height of the vertical direction Z. The length X1 in the first direction may vary depending on the number of arrangements of the light emitting devices 105, for example, may be 30 mm or more. The width Y1 in the second direction may be 16 mm or more. The width Y1 of the second direction Y of the lighting module 200 may provide a region in which light emitted from the light emitting device 105 diffuses and a region protecting the rear of the light emitting device 105. The lighting module 200 may be a flexible module or a rigid module. The lighting module 200 may be flat or flexible with respect to at least one of the first and second directions X and Y.

The lighting module 200 may include a front side surface S1 facing the light emitting device 105, a rear side surface S2 opposite the front side surface S1, and a plurality of side surface S3 and S4 extending from both end portions of the front side surface S1 and the rear side surface S2 in the second direction. The rear side surface S2 extends in the first direction X, and the front side surface S1 faces the rear side surface S1 and may include a curved surface. The length of the first direction X of the front side surface S1 and the rear side surface S2 may be greater than the height or thickness of the vertical direction. The maximum lengths of the first direction X of the front side surface S1 and the rear side surface S2 may be the same or different from each other. The height or thickness in the vertical direction of the front side surface S1 and the rear side surface S2 may be the same. The plurality of side surfaces S3 and S4 include a first side surface S3 and a second side surface S4 facing each other. The front side surface S1 and the rear side surface S2 may have a long length in the first direction X. The first side surface S3 and the second side surface S4 may face each other in a second direction Y perpendicular to the first direction X. The front side surface S1 may face the exit surface 111 of the light emitting device 105 or may be a surface exposed in the second direction from the first ends of the first side surface S1 and the second side surface S2. The rear side surface S2 may face a rear side of the plurality of light emitting devices 105 or may be a surface exposed in the second direction from the second end portions of the first side surface S3 and the second side surface S4. The first side surface S3 and the second side surface S4 may be a different side from the front side surface S1 and the rear side surface S2. The rear side surface of the light emitting device 105 may be a surface opposite to the exit surface 111.

Each the side surfaces S1, S2, S3, and S4 of the lighting module 200 may be each side surface of the resin layer 220 having the thickest thickness in the lighting module 200.

The plurality of light emitting devices 105 may be arranged in the first direction in the lighting module 200. Two or more light emitting devices 105 may be disposed in the first direction, and may be, for example, n (n=2 or more). The plurality of light emitting devices 105 may be arranged on a straight line extending in the first direction X. The plurality of light emitting devices 105 may be arranged in one row. In another example, the plurality of light emitting devices may be arranged in two rows, and the two rows of light emitting devices may be arranged in a zigzag form. A front side or the exit surface of the light emitting device 105 may be exposed toward the second direction Y. The side surface or rear side of the light emitting device 105 may be a non-exit surface.

The plurality of light emitting devices 105 may face the front side surface S1. The exit surfaces 111 of the plurality of light emitting devices 105 may face the front side surface S1. The light emitted from the light emitting device 105 is emitted through the front side surface S1, and some light may be emitted through at least one of the rear side surface S2, the first side surface S3, and the second side surface S4. That is, most of the light emitted from the light emitting device 105 may be emitted through the front side surface S1.

As shown in FIG. 4, the distance D2 between the light emitting device 105 and the front side surface S1 and the distance D3 between the light emitting device 105 and the rear side surface S2 based on the light emitting device 105 may be different from each other. The distance D3 between the light emitting device 105 and the rear side surface S2 may be 2 mm or more, for example, in a range of 2 mm to 20 mm. When the distance D3 between the light emitting device 105 and the rear side surface S2 is smaller than the above range, the region where moisture may penetrate or form a circuit pattern may be small, and when the distance D3 is larger than the above range, a size of the lighting module 200 may increase. The distance D2 is a maximum distance, may be 5 mm or more, and may range from 5 mm to 20 mm. When the distance D2 is smaller than the above range, hot spots may be generated, and when the distance D2 is larger than the above range, the module size may increase.

FIGS. 1 to 3, the lighting module 200 may include a plurality of convex portions P0: P1, P2, and P3 and at least one concave portion C1 and C2. The plurality of convex portions P0: P1, P2, P3 may be at least two or n (n=2 or more). The plurality of convex portions P0: P1, P2, and P3 may be disposed in the first direction in which the plurality of light emitting devices 105 may be arranged, and may protrude convexly in the second direction orthogonal to the first direction. The plurality of convex portions P0: P1, P2, and P3 may face the plurality of light emitting devices 105. Each of the plurality of convex portions P0: P1, P2, and P3 may protrude in a direction away from each of the light emitting devices 105: 101, 102, and 103. That is, the convex portions P0: P1, P2, and P3 may have a distance from the light emitting device 105 as the region facing the center of the light emitting device 105 may be increase.

Each of the convex portions P0: P1, P2, and P3 may protrude in the direction of the front side surface S1 with respect to each of the light emitting devices 105. The recesses C1 and C2 may be recessed toward the rear side surface S2 with respect to the front side surface S1. The convex portions P1, P2, and P3 may include convex curved surfaces. The concave portions C1 and C2 may include concave curved surfaces. The convex portions P1, P2 and P3 may have a first curvature, and the second concave portions C1 and C2 may have a second curvature having a radius smaller than the radius of the first curvature.

In the convex portions P0: P1, P2, and P3, the front side surface S1 has a constant height, and the upper surface and the lower surface may be provided as horizontal planes. The front side surface S1 may be provided as a vertical surface in the third direction Z. The rear side surface S2, the first side surface S3, and the second side surface S4 may be provided as vertical surfaces in the third direction. The rear side surface S2 may be arranged in a direction perpendicular to the first side surface S3 and the second side surface S4. The third direction Z may be a direction orthogonal to the first and second directions X and Y. As another example, the front side surface S1 may include a surface inclined with respect to the third direction Z. The front side surface S1, the rear side surface S2, the first side surface S3, and the second side surface S4 may have the same thickness or the same height in the third direction Z.

The resin layer 220 may be disposed between the substrate 210 and the second reflective layer 240. The resin layer 220 may be disposed between the upper surface of the substrate 210 and the lower surface of the second reflective layer 240. The resin layer 220 includes the front side surface S1, the rear side surface S2, the first side surface S3, and the second side surface S4. The resin layer 220 may surround or embed the plurality of light emitting devices 105 disposed on the substrate 210.

The lighting module 200 may include the first reflective layer 230 between the resin layer 220 and the substrate 210. The resin layer 220 may be a transmissive layer. The resin layer 220 is a different material, and may include a glass material.

The plurality of light emitting devices 105: 101, 102, 103 are, for example, a first light emitting device 101 adjacent to the first side surface S3, a third light emitting device 103 adjacent to the second side surface S4, and the at least one or two or more second light emitting devices 102 disposed between the first and third light emitting devices 101 and 103. As described below, the number of the light emitting devices may be n (n is 2 or more), and for convenience of description, three light emitting devices will be described as an example.

The convex portions P1, P2, and P3 may include a first convex portion P1 corresponding to the first light emitting device 101, a second convex portion P2 corresponding to the second light emitting device 102, and a third convex portion P3 corresponding to the third light emitting device 103. The concave portions C1 and C2 may include a first concave portion C1 disposed between the first and the second convex portions P2 and P3, and a second concave portion C2 disposed between the second and third convex portions P2 and P3. Each of the first to third convex portions P1, P2, and P3 may face the exit surface 111 of each of the first to third light emitting devices 101, 102, and 103.

The first convex portion P1 overlaps with the first light emitting device 101 in the second direction Y, and the second convex portion P2 overlaps with the second light emitting device 102 in the second direction Y, and the third convex portion P3 may be overlapped with the third light emitting device 103 in the second direction Y. Each of the first to third convex portions P1, P2, and P3 is disposed to overlap each of the first to third light emitting devices 101, 102, and 103 in the second direction, and may diffuse the light emitted from the exit surface 111 of the first to third light emitting devices 101, 102, 103. To this end, the first to third convex portions P1, P2, and P3 may overlap each exit surface 111 of the first to third light emitting devices 101, 102, and 103 in the second direction Y.

The first to third convex portions P1, P2, and P3 may overlap in the first direction, and the first and second concave portions C1 and C2 may overlap in the first direction. Among the convex portions P0: P1, P2, and P3, a region overlapped with the light emitting devices 105: 101, 102, and 103 in the second direction may be closer to a higher point of the convex portion P0 than the concave portions C1, C2.

The first concave portion C1 may overlap a region between the first and second light emitting devices 101 and 102 in the second direction, and the second concave portion C2 may overlap a region between the second and third light emitting devices 102 and 103 in the second direction. The first and second recesses C1 and C2 may transmit or reflect some incident light. The first and second concave portions C1 and C2 may suppress the occurrence of dark portions in the region between the first to third light emitting devices 101, 102 and 103.

The substrate 210 includes a printed circuit board (PCB), for example, a resin-based printed circuit board (PCB), a metal core PCB, a flexible PCB, and a ceramic PCB, or FR-4 substrate. The substrate 210 may be a flexible or non-flexible material. A circuit pattern may be disposed on the substrate 210. The circuit pattern of the substrate 210 may include a plurality of pads on a region corresponding to the light emitting device 105.

Among the regions of the substrate 210, a rear region based on the light emitting device 105 is a region opposite to a region where light is emitted, and may be a region in which a circuit patterns for connecting the light emitting devices 105 may be disposed. The width of the rear region may vary depending on the number of the light emitting devices 105 or the connection method of the light emitting devices 105. The width of the rear region is the distance D3 between the light emitting device 105 and the rear side surface S2, and may be provided in 2 mm or more. Accordingly, it is possible to suppress the penetration of moisture from the rear side of the light emitting device 105 and the circuit patterns for connecting the plurality of light emitting devices 105 may form.

The plurality of light emitting devices 105 may be provided with bonding portions thereunder and electrically connected to pads of the substrate 210. The plurality of light emitting devices 105 may be connected in series by the circuit patterns of the substrate 210. As another example, the plurality of light emitting devices 105 may be connected in parallel by circuit patterns of the substrate 210, or two or more groups connected in series may be connected in parallel.

The light emitting device 105 may include a device having a light emitting chip or a package in which an LED chip is packaged. The light emitting chip may emit at least one of blue, red, green, and ultraviolet (UV) light. The light emitting device 105 may emit at least one of white, blue, red, and green. The light emitting device 105 emits light in a lateral direction and a bottom portion thereof may be disposed on the substrate 210. The light emitting device 105 may be a side view type package. As another example, the light emitting device 105 may be an LED chip, and one surface of the LED chip may be opened and a reflective member may be disposed on the other surface.

The exit surface 111 of the light emitting device 105 may be disposed on a surface adjacent to the substrate 210, for example, and may be disposed on a side surface adjacent to the upper surface of the substrate 210. The exit surface 111 is disposed to the side surface between the bottom and the upper surface of the light emitting device 105, and emits light in the second direction Y. The exit surface 111 of the light emitting device 105 may be a surface adjacent to the first reflective layer 230 and may be a perpendicular surface to the upper surface of the substrate 210 and the upper surface of the first reflective layer 230.

The thickness of the light emitting device 105 may be smaller than the length of the first direction X of the light emitting device 105. The thickness of the light emitting device 105 may be 3 mm or less, for example, 2 mm or less. The thickness of the light emitting device 105 may be in the range of 1 mm to 2 mm, for example, in the range of 1.2 mm to 1.8 mm.

The length of the light emitting device 105 in the first direction X may be greater than the thickness of the light emitting device 105, for example, may be 1.5 times or more the thickness of the light emitting device 105. Since the light emitting device 105 has a thin thickness and a long length in the first direction, the light exit angle in the first direction X in the left-right direction based on the center of the light emitting device 105 may be widely provided. Here, the light exit angle of the light emitting device 105 in the first direction X may be greater than the light exit angle of the third direction Z in the up-down direction. The light exit angle of the first direction of the light emitting device 105 may have a range of 110 degrees to 160 degrees. The length of the first direction X of the light emitting device 105 may be greater than the width of the second direction of the light emitting device 105.

Here, as shown in FIG. 2, the thickness Za of the substrate 210 may be smaller than the thickness of the light emitting device 105. The thickness of the light emitting device 105 may be two or more times the thickness Za of the substrate 210, for example, may range from 2 to 4 times. Since the thickness Za of the substrate 210 is provided thin, the lighting module 200 may be provided as a flexible plate.

As shown in FIGS. 2 to 4, the resin layer 220 may be disposed on the substrate 210. The first reflective layer 230 may be disposed between the resin layer 220 and the substrate 210. The resin layer 220 may cover the light emitting device 105. The resin layer 220 may contact the upper surface and side surfaces of the light emitting device 105. The resin layer 220 may contact the upper surface of the first reflective layer 230. A portion of the resin layer 220 may contact the substrate 210 through the first reflective layer 230. The resin layer 220 may contact the exit surface 111 of the light emitting device 105. The front side surface S1, the rear side surface S2, the first side surface S3 and the second side surface S4 of the resin layer 220 are side surfaces between the first and second reflective layers 230 and 240. The front side surface S1, the rear side surface S2, the first side surface S3 and the second side surface S4 may be a periphery surfaces of the light emitting device 105 or surfaces corresponding to the side surfaces of the light emitting device 105.

An area of the upper surface of the resin layer 220 may be the same as an area of the upper surface of the substrate 210. The area of the upper surface of the resin layer 220 may be the same as an area of the upper surface of the first reflective layer 230. The area of the upper surface of the resin layer 220 may be the same as the area of the upper surface of the second reflective layer 240. The length X1 of the resin layer 220 in the first direction may be the same as the length of the substrate 210. The length X1 of the resin layer 220 in the first direction may be the same as the length of the first reflective layer 230. The length X1 of the resin layer 220 in the first direction may be the same as the length of the second reflective layer 240. The maximum width Y1 of the resin layer 220 in the second direction may be the same as the maximum width of the substrate 210. The maximum width Y1 of the resin layer 220 in the second direction may be the same as the maximum width of the second reflective layer 240. The minimum width of the resin layer 220 in the second direction may be the same as the minimum width of the substrate 210. The minimum width of the resin layer 220 in the second direction may be the same as the minimum width of the first reflective layer 230. The minimum width of the resin layer 220 in the second direction may be the same as the minimum width of the second reflective layer 240. The maximum width in the second direction is the length between the peak of the convex portions P1, P2, and P3 of the lighting module and the rear side surface S2, and the minimum width may be a length between the lower point of the concave portions C1 and C2 of the lighting module and the rear side surface S2.

The resin layer 220 may be disposed between the first and second reflective layers 230 and 240. The first and second reflective layers 230 and 240 may have the same area and face each other on the lower surface and the upper surface of the resin layer 220. Accordingly, the resin layer 220 may diffuse light emitted from the light emitting device 105 and light reflected by the first and second reflective layers 230 and 240 to guide the lateral direction.

The resin layer 220 may be formed to a thickness Zb greater than the thickness of the light emitting device 105. Accordingly, the resin layer 220 may protect the upper portion of the light emitting device 105 and prevent moisture penetration. Since the substrate 210 is disposed under the light emitting device 105 and the resin layer 220 is disposed on the light emitting device 105, the light emitting device 105 may be protected. Therefore, an interval between the upper surface of the resin layer 220 and the light emitting device 105 may be arranged in a range of 0.6 mm or less, for example, 0.5 mm to 0.6 mm. The upper portion of the resin layer 220 is disposed at the same thickness as the interval, thereby protecting the upper portion of the light emitting device 105.

The thickness Zb of the resin layer 220 may be an interval between the upper surface and the lower surface of the resin layer 220. The thickness Zb of the resin layer 220 may be a distance between the first and second reflective layers 230 and 240. The thickness Zb may be equal to a distance (e.g., Zb) between the first and second reflective layers 230 and 240. The thickness Zb may be smaller than the distance between the front side surface S1 and the rear side surface S2. For example, the distance between the front side surface S1 and the rear side surface S2 may include the maximum width or the minimum width. The maximum width may be a straight line distance between the high point of the convex portions P1, P2, and P3 and the rear side surface S2. The distance or interval between the first and second side surfaces S3 and S4 of the resin layer 220 may be greater than the distance between the high point of the convex portions P1, P2, and P3 and the rear side surface S2. The minimum width may be a straight line distance between the bottom of the concave portions C1 and C2 and the rear side surface S2. The distance or interval between the first reflective layer 230 and the second reflective layer 240 may be smaller than the distance or interval between the front side surface S1 and the rear side surface S2 of the resin layer 220. By arranging the distance between the first and second reflecting layers 230 and 240 smaller than the width Y1 or the minimum width in the second direction of the lighting module 200, a line-form surface light source is provided, and a brightness and hot spots may prevent. In addition, the lighting module may be provided with flexible characteristics that may be convex or concave in the third direction.

The thickness Zb of the resin layer 220 may be 2 times or less than the thickness of the light emitting device 105, and may be, for example, more than 1 to 2 times. The thickness Zb of the resin layer 220 may be, for example, in the range of 1.5 mm to 1.9 mm or in the range of 1.6 mm to 1.8 mm. The thickness Zb of the resin layer 220 may be 0.8 times or less the thickness Z1 of the lighting module 200, for example, and may be in a range of 0.4 to 0.8 times the thickness Z1 of the lighting module 200. Since the thickness of the resin layer 220 is disposed at a difference of 1.2 mm or less from the thickness Z1 of the lighting module 200, a decrease in light efficiency in the lighting module 200 may prevent and the ductility characteristics may enhance.

The resin layer 220 may include a resin material such as silicone, silicone molding compound (SMC), epoxy, or epoxy molding compound (EMC). The resin layer 220 may optionally include an ultraviolet (UV) curable resin or a heat curable resin material, and PC, OPS, PMMA, PVC, and the like. For example, a resin material having a urethane acrylate oligomer as a main raw material may be used as the main material of the resin layer 220. For example, a urethane acrylate oligomer which is a synthetic oligomer may be used by mixing with a polyacrylic polymer type. Of course, the low-boiling dilution type reactive monomers such as IBOA (isobornyl acrylate), HPA (Hydroxyl propyl acrylate, 2-HEA (2-hydroxyethyl acrylate), etc.) may further include a mixed monomer, and may be mixed a photo initiator (for example, 1-hydroxy cyclohexyl phenyl-ketone, etc.) or antioxidants as an additive.

A bead (not shown) may be included in the resin layer 220, and the bead may diffuse and reflect incident light, thereby increasing the amount of light. The resin layer 220 may include a phosphor. The phosphor may include at least one of a yellow phosphor, a green phosphor, a blue phosphor, and a red phosphor.

The region where the convex portions P1, P2, and P3 are formed in the resin layer 220 may be provided as a lens portion. The lens portion of the resin layer 220 is provided in a lens shape having a convex curved surface, and may include a hemispherical shape when viewed from a top view. The distance from the light emitting device 105 to the lens portion may be further spaced apart from the region of lens portion that corresponds to the center of the light emitting device 105. The thickness of the lens portion in the third direction may be the thickness Zb of the resin layer 220. Since the upper and lower surfaces of the lens portion are flat and curved surfaces are formed toward the front side surface S1, light incident in a direction of the front side surface S1 may be diffused. The lens portion is disposed between the first and second reflective layers 230 and 240 which are flat on the upper and lower portions of the lens portions, so that light may be emitted by refracting light to the front side surface S1. The lens portion may refract light incident on a region outside the optical axis based on an optical axis at an exit angle greater than an incident angle.

In the resin layer 220, the concave portions C1 and C2 disposed between the convex portions P1, P2 and P3 are provided as recesses recessed in a direction of the rear side surface S2, and the concave portions C1 and C2 may include a concave curved surface or a curved surface having an inflection point. The recesses of the resin layer 220 may be formed as a concave curved surface on the surface of the resin layer 220 to refract the incident light. The recesses of the concave portions C1 and C2 refract light emitted from the light emitting device 105 on the region between the lens portions, thereby suppressing the occurrence of dark portions.

Here, when the convex portions P1, P2 and P3 and the concave portions C1 and C2 are disposed on the resin layer 220, the substrate 210 and the first and second reflective layers 230 and 240 has a shape corresponding to shapes of the convex portion and the concave portion. The convex portions P1, P2, and P3 or the lens portion of the resin layer 220 may be the same as the number of the light emitting devices 105.

The first reflective layer 230 may reflect light emitted from the light emitting device 105. The first reflective layer 230 may be formed on the upper surface of the substrate 210. The first reflective layer 230 may be formed as an upper layer of the substrate 210 or may be formed as a separate layer. The first reflective layer 230 may be adhered to the upper surface of the substrate 210 with an adhesive. The resin layer 220 may be adhered to the upper surface of the first reflective layer 230.

The first reflective layer 230 is provided with a plurality of holes 232 in a region corresponding to the lower surface of the light emitting device 105, and the light emitting device 105 may be connected to the substrate 210 through the hole 232. A portion of the resin layer 220 may contact the substrate 210 through the hole 232. The hole 232 may be a region where the light emitting device 105 is bonded to the substrate 210.

The first reflective layer 230 may be formed in a single layer or multilayer structure. The first reflective layer 230 may include a material that reflects light, for example, a metal or non-metal material. When the first reflective layer 230 is a metal, the first reflective layer 230 may include a metal layer such as stainless, aluminum (Al), or silver (Ag). When the first reflective layer 230 is a non-metallic material, the first reflective layer 230 may include a white resin material or a plastic material. The first reflective layer 230 may include a white resin material or a polyester (PET) material. The first reflective layer 230 may include at least one of a low reflection film, a high reflection film, a diffuse reflection film, or a regular reflection film. The first reflective layer 230 may be provided as, for example, a regular reflection film for reflecting incident light to the front side surface S1

The thickness Zc of the first reflective layer 230 may be smaller than the thickness Za of the substrate 210. The thickness Zc of the first reflective layer 230 is disposed at least 0.5 times the thickness Za of the substrate 210, thereby reducing transmission loss of incident light. The thickness Zc of the first reflective layer 230 may be in the range of 0.2 mm to 0.4 mm, and when it is smaller than the above range, light transmission loss may occur, and when it is thicker than the above range, the thickness Z1 of the lighting module 200 may increase.

The second reflective layer 240 may be disposed on the resin layer 220. The second reflective layer 240 may be adhered to the upper surface of the resin layer 220. The second reflective layer 240 is disposed in the entire region of the upper surface of the resin layer 220, thereby reducing light loss.

The second reflective layer 240 may be formed of the same material as the first reflective layer 230. The second reflective layer 240 may have a material having a higher light reflectivity than the material of the first reflective layer 230 or a thicker thickness in order to reflect light and reduce light transmission loss. The second reflective layer 240 may be the same thickness as the first reflective layer 230 or a thicker thickness. For example, the first and second reflective layers 230 and 240 may be provided with the same material and the same thickness.

The thickness Zd of the second reflective layer 240 may be smaller than the thickness Za of the substrate 210. The thickness Zd of the second reflective layer 240 is disposed at least 0.5 times the thickness Za of the substrate 210, thereby reducing transmission loss of incident light. The thickness Zd of the second reflective layer 240 may be in the range of 0.2 mm to 0.4 mm, and when it is smaller than the above range, light transmission loss may occur, and when it is thicker than the above range, the thickness Z1 of the lighting module 200 may increase.

The second reflective layer 240 may be formed in a single layer or multilayer structure. The second reflective layer 240 may include a material that reflects light, for example, a metal or non-metal material. When the second reflective layer 240 is a metal, the second reflective layer 240 may include a metal layer such as stainless, aluminum (Al), silver (Ag), and when the second reflective layer 240 is a non-metallic material, the second reflective layer 240 may include a white resin material or a plastic material. The second reflective layer 240 may include a white resin material or a polyester (PET) material. The second reflective layer 240 may include at least one of a low reflection film, a high reflection film, a diffuse reflection film, or a regular reflection film. The second reflective layer 240 may be provided as, for example, a regular reflection film so that incident light proceeds in a direction of the front side surface S1.

A stacked structure of the substrate 210, the first reflective layer 230, the resin layer 220, and the second reflective layer 240 may include the convex portions P1, P2, P3 and the concave portions C1 and C2. An upper surface and a lower surface of the convex portions P1, P2, and P3 have a flat shape, and may include a curved surface or a hemispherical shape in the first direction. The concave portions C1 and C2 may include the concave curved surface in a direction of the rear side surface S2.

The convex curved surface and the concave curved surface in the resin layer 220 may be formed as a haze surface to diffuse light. The haze surface may be treated as a rough surface than the inner surface of the resin layer 220 to diffuse the emitted light.

The lighting module 200 according to an embodiment of the invention may provide a thickness Z1 in the third direction in a line form, thereby providing ductility and providing a line-shaped surface light source. The lighting module 200 may have a thickness Z1 of 3 mm or less. That is, the lighting module 200 may be provided as a surface light source having a line shape of 3 mm or less. As another example, the lighting module 200 may be arranged to be 6 mm or less larger than 3 mm, in this case, the thickness of the lighting module 200 is increased, but the thickness of the resin layer 220 is provided thicker to increase the line width and the light distribution area may increase.

Referring to FIG. 2, when the thickness of each component in the lighting module 200, the thickness of the substrate 210 is Za, the thickness of the resin layer 220 is Zb, the thickness of the first reflective layer 230 is Zc and the thickness of the second reflective layer 240 is Zd, and there have the relationship of Zb>Za>Zd≥Zc. The interval between the upper surfaces of the second reflective layer 240 and the lower surface of the substrate 210 is the thickness Z1 of the lighting module 200. The thickness Zb is a ratio of 0.4 to 0.8 of Z1, the thickness Za is a ratio of 0.14 to 0.18 of Z1, and the thickness Zd or Zc may have a ratio of 0.08 to 0.12 of Z1. The Zb may have a ratio of 3.5 to 4 of Za. The Zb may have a ratio of 5.8 to 6.4 of Zc or Zd. The thickness Zb of the resin layer 220 is disposed to be thicker than the thickness Za of the substrate 210, so that the light emitting device 105 may be protected and guided by diffusing light and strengthening ductility characteristics.

Referring to FIG. 4, the maximum width W1 of the convex portions P1, P2 and P3 in the first direction is a distance between the adjacent concave portions C1 and C2, and may be equal to or smaller than the pitch G1 of the light emitting devices 105. When the maximum width W1 of the convex portions P1, P2, and P3 is greater than the pitch G1 between the light emitting devices 105, two or more light emitting devices on a region of the convex portions P1, P2, P3 105 may be arranged and may increase the luminosity. When the maximum width W1 of the convex portions P1, P2, and P3 is smaller than the pitch G1 between the light emitting devices 105, the size of the convex portions P1, P2, and P3 becomes small, and the light may provide in a uniform distribution, but the luminous intensity may be reduced.

The maximum width W1 of the convex portions P1, P2, and P3 may be 15 mm or more, for example, in a range of 15 mm to 20 mm. The maximum width W1 of the convex portions P1, P2, and P3 may be larger than the depth D4 of the concave portions C1 and C2. The ratio of the maximum width W1 of the convex portions P1, P2, and P3 and the depth D4 of the concave portions C1, C2 may range from 1:0.4 to 1:0.7. When the depths of the concave portions C1 and C2 are smaller than the above range, the dark region may be increased between adjacent convex portions P1, P2 and P3. When the depths of the concave portions C1 and C2 are greater than the above ranges, the light interference between the light emitting devices 105 may increase by proceeding to a region adjacent to the light emitting devices 105. The depth D4 of the concave portions C1 and C2 may be a straight-line distance from a straight line connecting the peaks of the convex portions P1, P2 and P3 to the lower points of the concave portions C1 and C2.

The curved surfaces of the convex portions P1, P2 and P3 and the curved surfaces of the concave portions C1 and C2 may have curvature. The radius of curvature of the convex portions P1, P2, and P3 may be 8 mm or more, for example, 8 mm to 14 mm or 9 mm to 11 mm. When the radius of curvature of the convex portions P1, P2, and P3 is smaller than the above range, the improvement of luminous intensity is minimal, and when it is larger than the above range, a dark portion may be generated.

The radius of curvature of the concave portions C1 and C2 may be ⅛ times smaller than the radius of curvature of the convex portions P1, P2, and P3. The ratio of the radius of curvature of the concave portions C1 and C2 and the radius of curvature of the convex portions P1, P2 and P3 may range from 1:8 to 1:28. When the radius of curvature of the concave portions C1 and C2 is smaller than the above range, the amount of light emitted through the concave portions C1 and C2 may be reduced to increase the dark portion, and when it is larger than the range, the convex portions P1 and P2, P3 may be reduced in size, and optical interference between the light emitting devices 105 may occur. Accordingly, the depths D4 and the radius of curvature of the concave portions C1 and C2 take into account the position of the light emitting device 105 and an angle of beam spread of the light emitting device 105, and may range the improvement of light uniformity by the recesses C1 and C2 and the convex portions P1, P2, and P3 and the suppression of dark portion by the recesses C1 and C2. The radius of curvature of the concave portions C1 and C2 may range from 0.5 to 1 mm. Since the concave portions C1 and C2 have a predetermined curvature and are provided in a curved shape, the incident light may be refracted and transmitted, thereby reducing the occurrence of dark portions in the concave portions C1 and C2.

The region between the peak of the convex portions P1, P2, and P3 and the light emitting device 105 is a region for diffusing light and emitting it with a uniform light distribution, which may be defined as a light diffusion region or a light guide region. The interval between the peak of the convex portions P1, P2, and P3 and the light emitting device 105 may range of 13 mm or more, for example, may range from 13 mm to 20 mm. The interval between the peak of the convex portions P1, P2, and P3 and the light emitting device 105 may be provided in a uniform distribution through light diffusion when in the range, and when the interval between the convex portions P1, P2 and P3 and the light emitting device 105 is smaller than the above range, a hot spot may be generated, and when it is larger than the above range, the luminous intensity may decrease and the size of the module may increase. The interval between the convex portions P1, P2, P3 and the light emitting device 105 may be larger than the radius of curvature of the convex portions P1, P2, and P3, for example, and may be in a range of 1.3 times or more or 1.3 to 2.0 times of the radius of curvature of the convex portions P1, P2, and P3.

The interval D1 between the concave portions C1 and C2 and the straight lines connecting the light emitting devices 105 may be smaller than the depth D4 of the concave portions C1 and C2. The interval D1 may be 5 mm or more, for example, in a range of 5 mm to 12 mm, and when it is smaller than the interval D1, the depth D4 of the concave portions C1 and C2 is deepened or a distance D2 between the light emitting device 105 and the convex portions P1, P2, and P3 may be narrowed, and a dark portion may be generated in the concave portions C1, C2 or a hot spot may be generated in the convex portions P1, P2, and P3.

Figure 15:
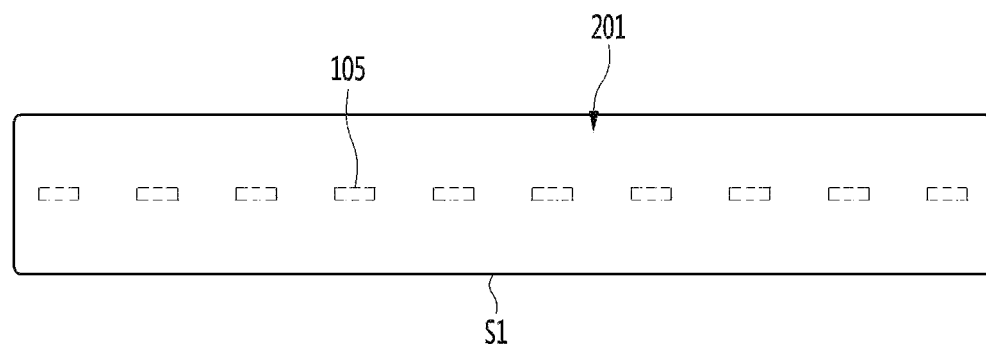
FIG. 15 is an example in which the front side surface is flat in the lighting module according to the embodiment of the invention.
Figure 16:
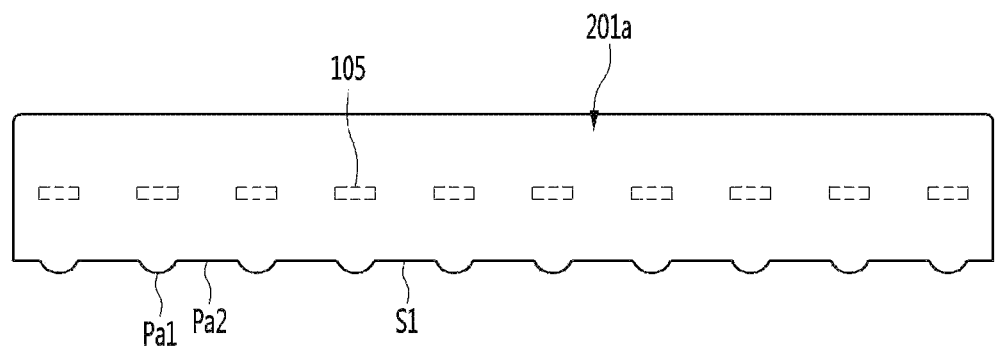
FIGS. 16 to 19 are examples of changing the curvature of the convex portion in the lighting module according to the embodiment of the invention.
Figure 37A:
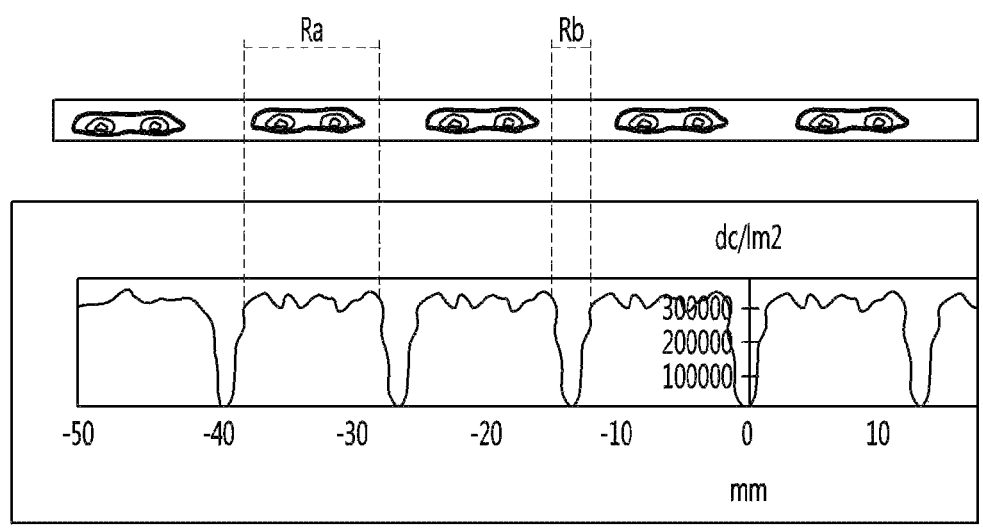
FIGS. 37A and 37B are views showing a lighting image and its distribution by the lighting module of FIG. 1.
Figure 37B:
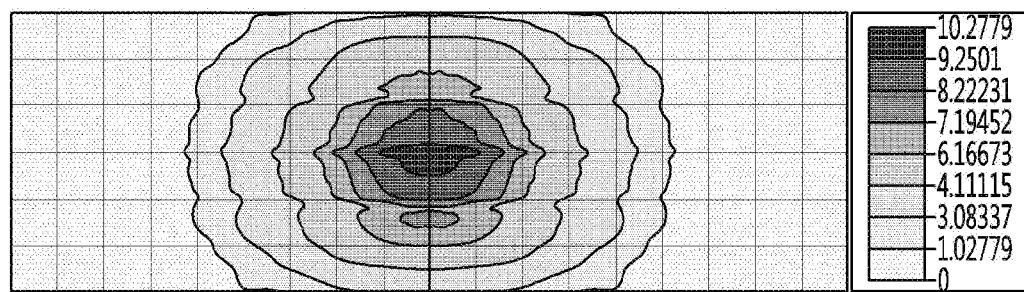
Figure 38A:
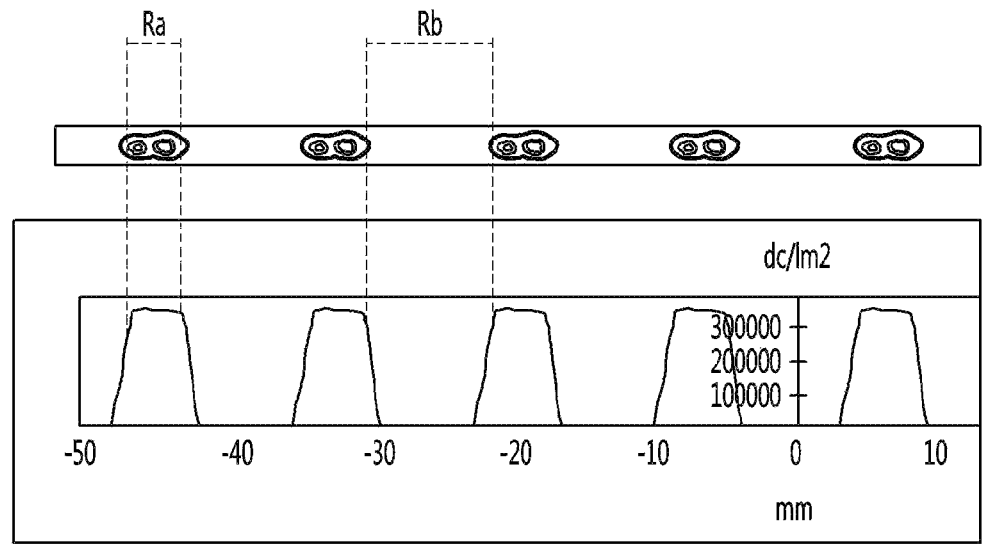
FIGS. 38A and 38B are views showing a lighting image and its light distribution by the lighting module of FIG. 15.
Figure 38B:
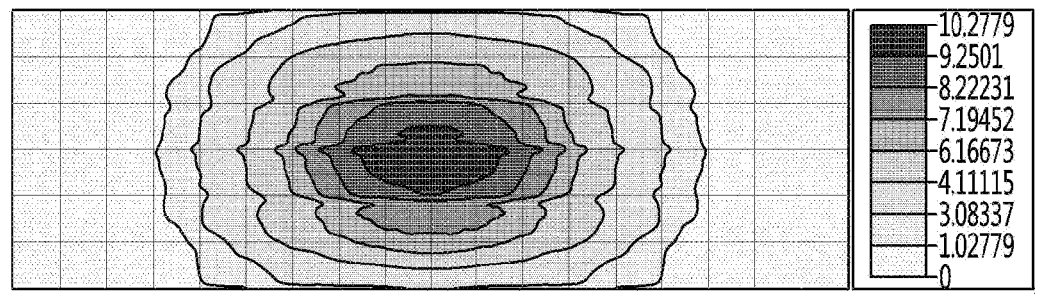

Referring to FIG. 5, among the light emitted from the light emitting device 105, the light L1 traveling in the optical axis direction passes through the center of the convex portions P1, P2, and P3, and the light L2 emitted around the optical axis is emitted at an exit angle greater than the incident angle, thereby diffusing light. In addition, the light L3 incident on the concave portions C1 and C2 is refracted and transmitted or reflected and emitted by the convex portions P1, P2 and P3, thereby reducing the occurrence of dark portions on the concave portions C1 and C2. That is, as shown in FIG. 37, in the lighting module according to the embodiment of the invention, the dark region Rb is smaller than the bright region Ra in the emitted luminous intensity distribution as shown in (a), and may have a distribution of the equiluminance curve of light as shown in (b). FIG. 38 is a structure having a flat front side surface without a convex portion and a concave portion in a lighting module according to an embodiment of the invention, and may be provided as a module as shown in FIG. 15, in a luminous intensity distribution, a dark region Rb becomes greater than a bright region Ra, and has an equiluminance curve distribution as in (b).

Referring to FIG. 6, an angle R0 between the center of the light emitting device 105 and the low point of the concave portion C0 based on a straight line passing through the center of the light emitting device 105 and the center of the convex portion P0 may range from 50 degrees or more, for example, in a range from 50 degrees to 80 degrees. The concave portion C0 is spaced apart from the angle R0 to receive light from the light emitting device 105 and refract it to emit the light. The convex portion P0 and the concave portion C0 may include convex portions P1, P2, and P3 and the concave portions C1, C2 disclosed in FIGS. 1 to 5.

FIG. 7 is an exploded perspective view of a lighting module according to an embodiment of the invention, and FIGS. 8 to 13 are views illustrating a manufacturing process of the lighting module according to an embodiment of the invention. In describing the lighting module, the same parts as the above configuration will be referred to the above description.

Figure 8:
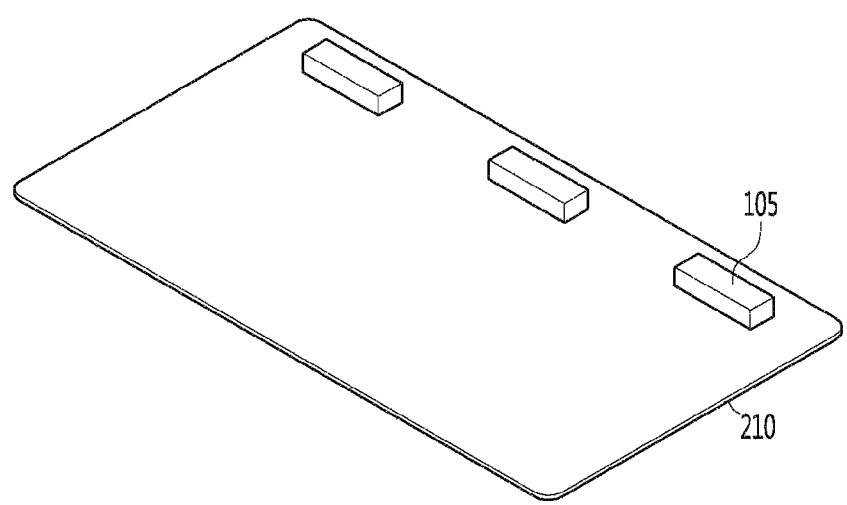
FIGS. 8 to 13 are views illustrating a manufacturing process of the lighting module of FIG. 1.

Referring to FIGS. 7 and 8, two or more light emitting devices 105 may be arranged on the substrate 210 in the first direction. The light emitting devices 105 to be disposed on the substrate 210 may be arranged to emit light toward the front side surface or in a front direction. As another example, the light emitting devices 105 on the substrate 210 are arranged in one column, but may be arranged in two columns, but are not limited thereto.

Figure 9:
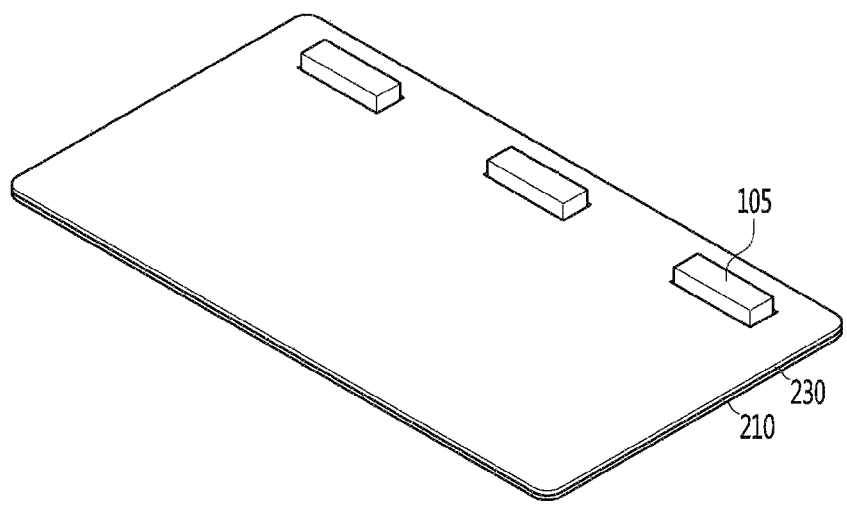

Referring to FIGS. 7 and 9, a first reflective layer 230 prepared in advance is attached to the substrate 210. A hole 232 into which the light emitting device 105 is to be inserted may be formed in the first reflective layer 230. The first reflective layer 230 is disposed around the light emitting device 105 and is attached to the substrate 210 to reflect light emitted from the light emitting device 105. The first reflective layer 230 may not be formed when a resist material of a reflective material is disposed on the substrate 210, but is not limited thereto. The first reflective layer 230 has thinner thickness than the thickness of the light emitting device 105 and may be disposed below the exit surface of the light emitting device 105. The first reflective layer 230 may be a plastic material, or a metal or non-metal material.

Figure 10:
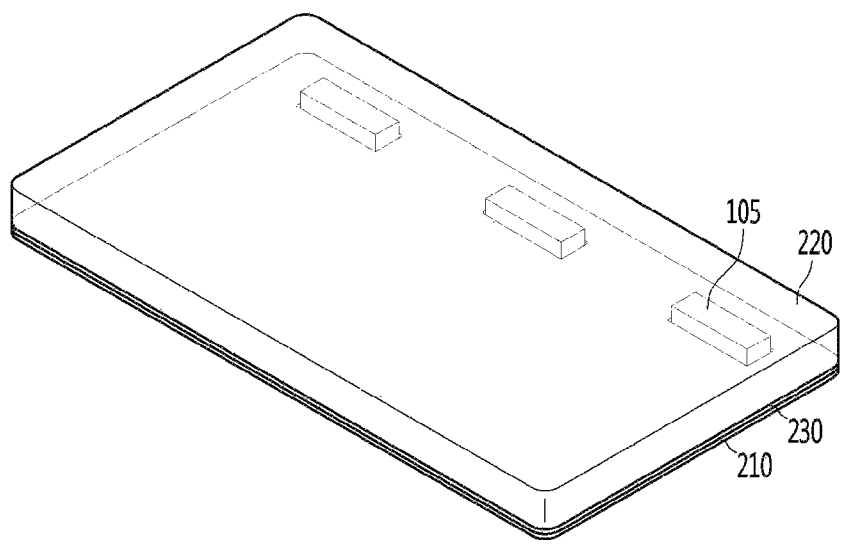

Referring to FIGS. 7 and 10, a resin layer 220 is formed on the first reflective layer 230. The resin layer 220 may be molded on the first reflective layer 230 and the light emitting device 105. The resin layer 220 may be formed to a thickness capable of covering the light emitting device 105. The resin layer 220 may be formed of a transparent resin material, for example, a material such as silicone, silicone molding compound, epoxy or epoxy molding compound, UV curable resin or heat curable resin.

The resin layer 220 may be provided with a thickness that is thicker than the thickness of the light emitting device 105, and may be arranged to be twice or less, for example, 1.5 times or less, the thickness of the light emitting device 105. The resin layer 220 may be formed by a dispensing process.

Figure 11:
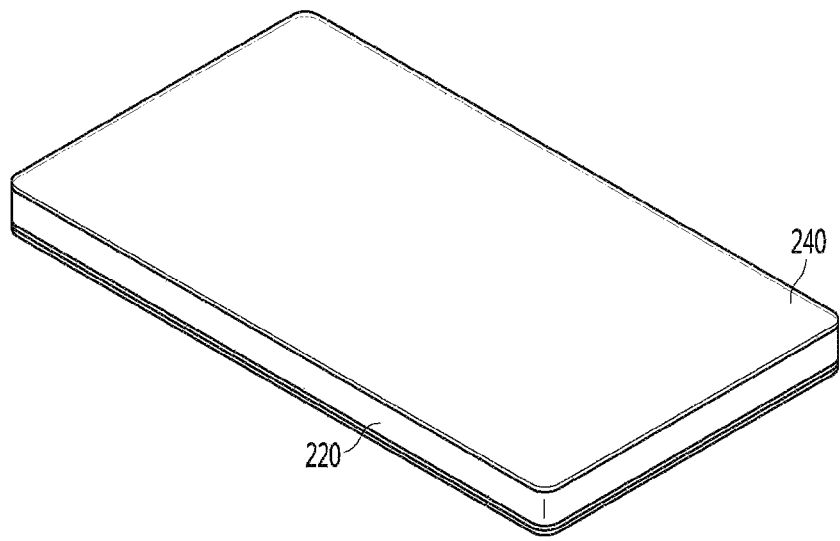

Referring to FIGS. 7 and 11, a second reflective layer 240 is formed on the upper surface of the resin layer 220 before the resin layer 220 is cured. The second reflective layer 240 may cover the entire upper surface of the resin layer 220. The second reflective layer 240 may be attached using an adhesive after the resin layer 220 is cured as another example.

Figure 12:
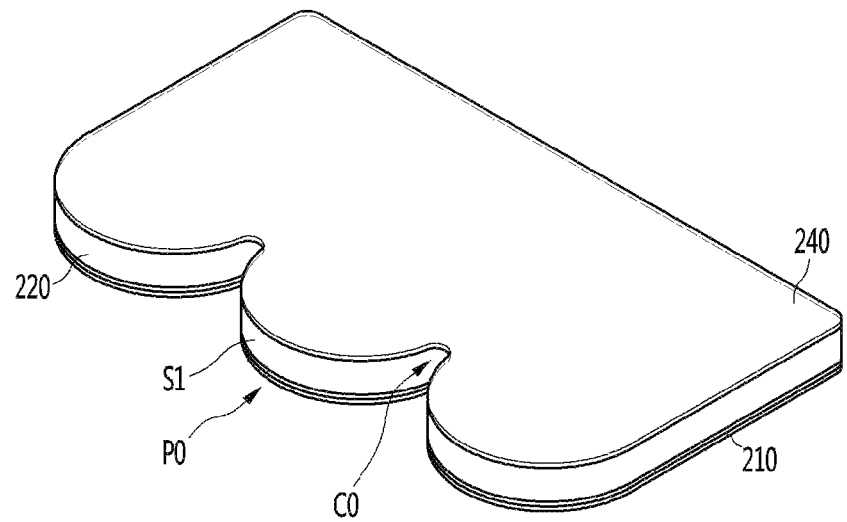
Figure 13:
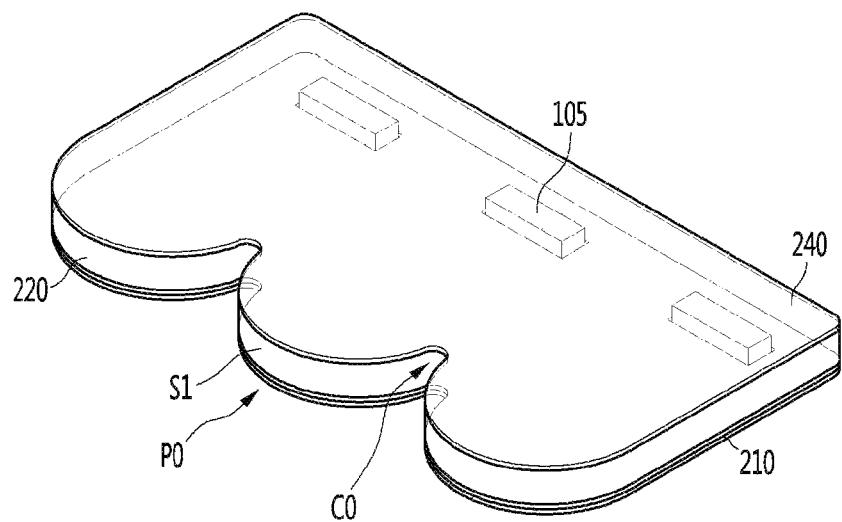

Referring to FIGS. 7 and 12, when the second reflective layer 240 is formed, structures from the substrate 210 to the second reflective layer 240 are cut using cutting equipment, as shown in FIGS. 1, 12 and 13. Here, the cutting equipment may be cut with a router, and a convex portions P0 and a concave portions P0 of the lighting module may be formed during the cutting.

Accordingly, in the lighting module, the front side surface S1 of the resin layer 220 and the front side surface S1 of the substrate 210 may be disposed on the same vertical plane. In addition, the resin layer 220 may be disposed on the same vertical plane as the front side surface S1, the first reflective layer 230, and the second reflective layer 240. Each of the rear side surface S2, the first side surface S3, and the second side surface S4 of the resin layer 220 may be disposed on the same vertical plane as the rear side surface, the first side surface, and the second side of the substrate 210, respectively. Each of the rear side surface S2, the first side surface S3, and the second side surface S4 of the resin layer 220 may be disposed on a perpendicular plane such as the rear side, the first side surface and the second side surface of the first and second reflective layers 230 and 240.

Accordingly, as shown in FIGS. 7, 12, and 13, the light emitted from the light emitting device 105 may be emitted through the front side surface S1 of the resin layer 220. Some light reflected from the inside may be emitted to the rear side surface S2, the first side surface S3, and the second side surface S4 of the resin layer 220.

Figure 14:
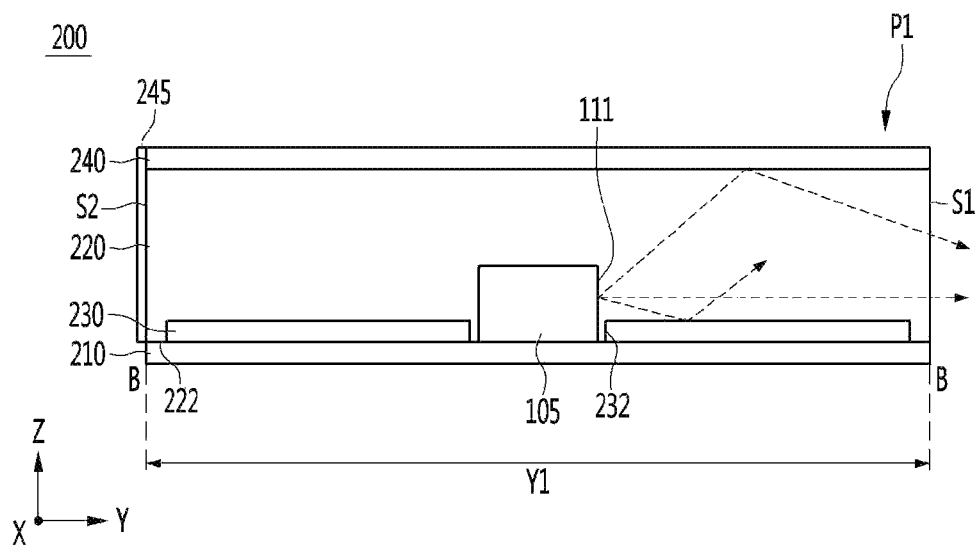
FIG. 14 is another example of the lighting module of FIG. 2.

FIG. 14 is another example of the lighting module of the invention. As illustrated in FIG. 14, the first reflective layer 230 may be spaced apart from the edge of the substrate 210 and a portion 222 of the resin layer 220 may contact an upper surface of the edge side of the substrate 210. When the resin layer 220 is in contact with the edge of the substrate 210, moisture penetration may be suppressed.

As another example, in the lighting module as shown in FIGS. 2 and 14, a third reflective layer 245 may be further disposed on the surfaces S2, S3, and S4 excluding the front side surface S1 among the side surfaces of the resin layer 220. The third reflective layer 245 may prevent leakage of light and increase the amount of light extracted to the front side surface S1. The third reflective layer 245 may be a material of the first and second reflective layers 230 and 240 disclosed above. The third reflective layer 245 may contact or be spaced apart from the side surface of the resin layer 220.

In the following description, it has a stacked structure of the lighting modules as shown in FIGS. 3 and 7, and is a configuration in which the above-described configurations are partially changed in consideration of a variable of luminous intensity degradation in the lighting modules. In the following description, the changed parts of each configuration will be mainly described, and the above configuration may be selectively applied.

FIG. 15 is a structure in which the lighting module disclosed above provides a flat front side surface S1 without convex portions and concave portions. The lighting module may be stacked in the structure of FIG. 7. The luminous intensity in the horizontal and vertical directions of the lighting module as shown in FIG. 15 may be lowered, and the dark portion may be larger than the bright portion as shown in FIG. 38 without convex portions and concave portions. In this case, a diffusion agent may be added in the resin layer to prevent hot spots or provide a longer light guiding distance.

FIGS. 16 to 19 are examples of changing the curvature of the convex portion in the lighting module according to the embodiment of the invention. The lighting module 201a of FIG. 16 has a radius of curvature of 5±0.5 mm of the convex portion Pa1 corresponding to the light emitting device 105, and in this case, the luminance intensity in the horizontal and vertical directions may be 7.5 cd or less. In this case, the region Pb2 between the convex portion Pa1 and the convex portion Pa1 is provided in a large region with a flat surface, and thus there is a limit in improving the luminance intensity.

Figure 17:
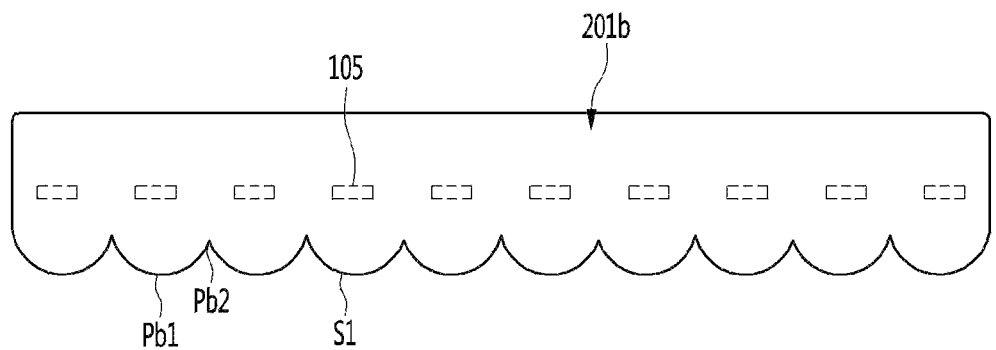
Figure 18:
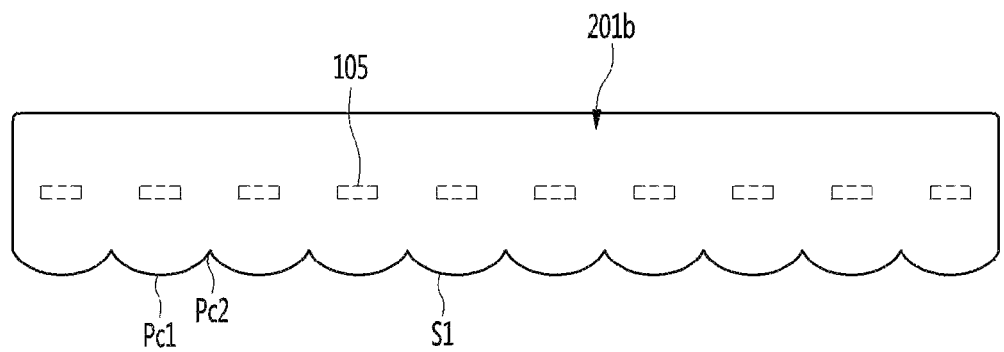
Figure 19:
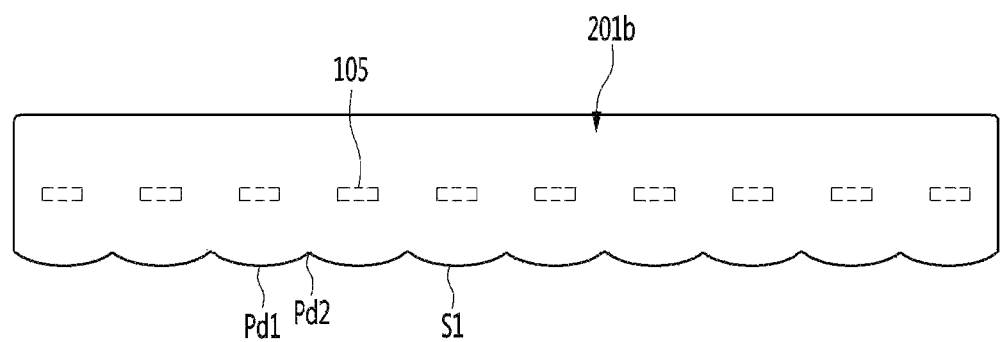

FIGS. 17 to 19 are structures in which the radius of curvature of the convex portions Pb1, Pc1, and Pd1 corresponding to the light emitting device 105 in the lighting module 201b of the invention is gradually increased. FIG. 17 has a radius of curvature of the convex portion Pb1 in the range of 8 mm to 11 mm, FIG. 18 has a radius of curvature of the convex portion Pc1 in the range of 11 mm to 14 mm, and FIG. 19 has a radius of curvature of the convex portion Pd1 in the range of 15 mm to It is in the range of 21 mm. At this time, it may be seen that in the structures as shown in FIGS. 17 and 18, the luminance intensity in the horizontal and vertical directions is 8.5 cd or more, and in FIG. 19, the luminance intensity in the horizontal and vertical directions is reduced to 7.5 cd or more and 8.2 cd again. Therefore, when the lighting module of the invention provides a luminance intensity of 7.5 cd or more, the radius of curvature described above may be selectively applied. When the light module has the best luminance intensity, the radius of curvature of the convex portions Pb1, Pc1, and Pd1 may be provided in a range of 8 mm to 14 mm, and the concave portions Pb2, Pc2, and Pd2 in the region between the convex portions Pb1, Pc1, and Pd1 due to the radius of curvature of the convex portions Pb1, Pc1, and Pd1 may be provided without a curve or have a radius of curvature of 0.5 mm to 1 mm. The convex portions Pb1, Pc1, Pd1 and concave portions Pb2, Pc2, and Pd2 of the lighting module are alternately arranged, since the convex portion P overlaps the light emitting device 105 in the second direction and may be extracted by diffusing the light incident and the concave portions Pb2, Pc2, and Pd2 may be extracted by refracting the light incident, the luminous intensity of the line-shaped surface light source may improve and hot spots may prevent. Here, the luminous intensity was measured under the condition that the distance between the light emitting device 105 and the front side surface S1 is 13 mm, and the air gap between the lighting module and the inner lens is 11 mm.

FIGS. 20 to 34 are examples of modifying the shape of the front side surface S1 in the lighting module of the invention. In this modification, when the convex portion and the concave portion disclosed above have a curvature, the luminous intensity may be lower than the luminous intensity in the horizontal and vertical directions.

Figure 20:
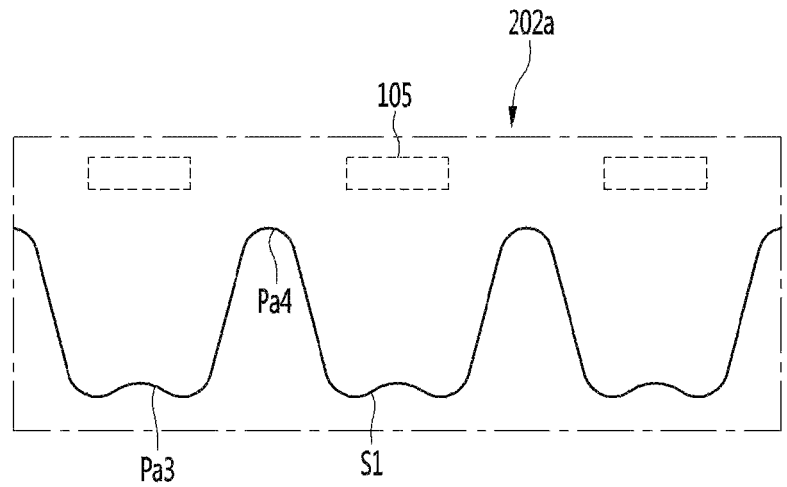
FIGS. 20 to 34 are modified examples of the convex portion and the concave portion in the lighting module according to the embodiment of the invention.

As shown in FIG. 20, a convex portion Pa3 and a concave portion Pa4 are alternately disposed on the front side surface S1 of the lighting module 202a, and the convex portion Pa3 is disposed to overlap the light emitting device 105, and the concave portion Pa4 disposed between the convex portions Pa3 may have a predetermined curvature. The convex portion Pa3 has a convex curved surface and may be provided as a recess having a concave curved surface as it corresponds to the center of the light emitting device 105.

Figure 21:
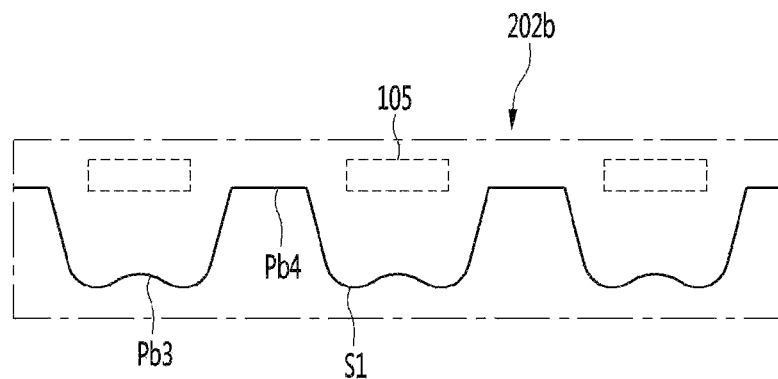

As shown in FIG. 21, the convex portion Pb3 and the concave portion Pb4 are alternately disposed on the front side surface S1 of the lighting module 202b, and the convex portion Pb3 is disposed to overlap the light emitting device 105, and the concave portion Pb4 between the convex portions Pb3 may have a flat surface. The convex portions Pb3 has a convex curved surface and may be provided as a recess having a concave curved surface as it corresponds to the center of the light emitting device 105. The flat surface (or low point) of the concave portion Pb4 may be disposed in a region between the light emitting devices 105.

Figure 22:
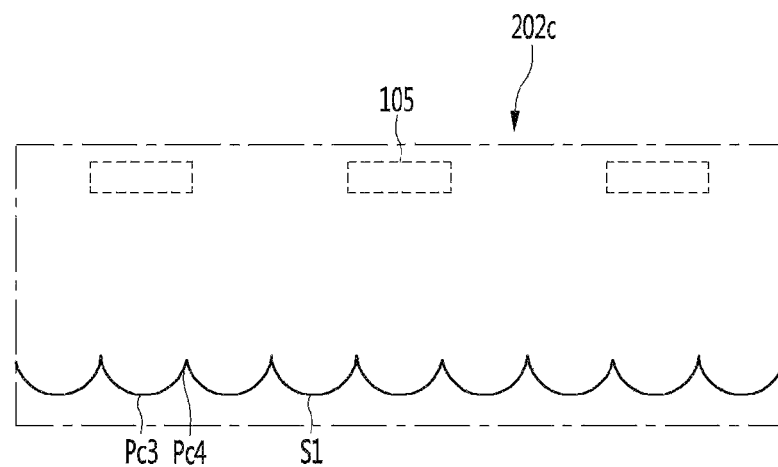

As shown in FIG. 22, a convex portion Pc3 and a concave portion Pc4 are alternately arranged on the front side surface S1 of the lighting module 202c, and the convex portion Pc3 has a maximum width smaller than the length of the light emitting device 105 in the first direction. Accordingly, two or more convex portions Pc3 overlapping the light emitting device 105 may be arranged. The concave portion Pc4 is disposed between the convex portions Pc3, and the concave portion Pc4 may be a curved surface having a negative curvature or a structure having an inflection point or an interface. The convex portion Pc3 may be spaced apart from the light emitting device 105 by 13 mm or more. In this case, since the size of the convex portion Pc3 is arranged with a micro lens, a uniform distribution of light may be provided, but a decrease in the luminous intensity may occur.

Figure 23:
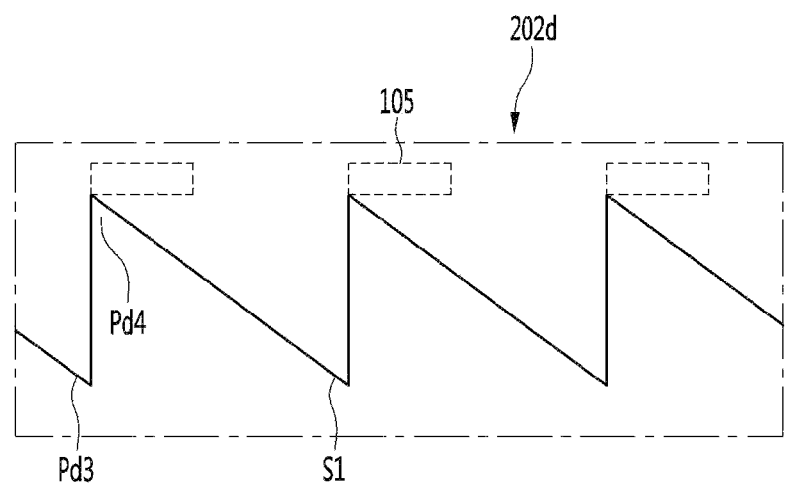
Figure 24:
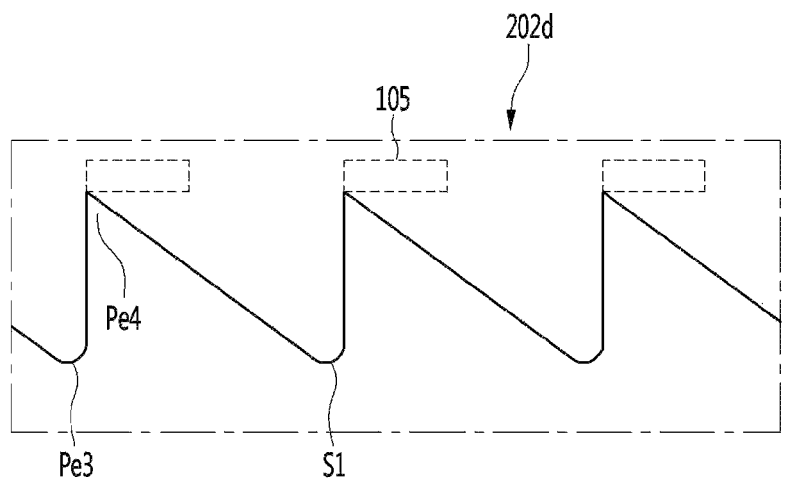
Figure 25:
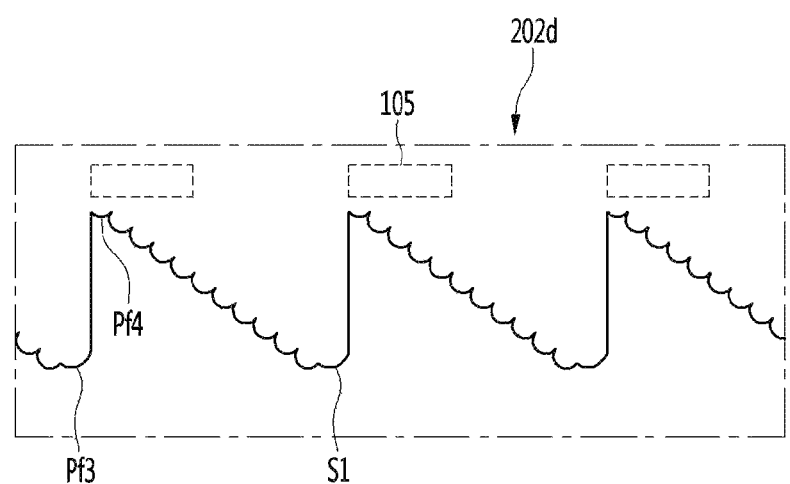

FIGS. 23 to 25, convex portions Pd3, Pe3, and Pf3 and concave portions Pd4, Pe4, and Pf4 are alternately disposed on the front side surface S1 of the lighting module 202d, and the convex portions Pd3, Pe3, and Pf3 may protrude in a triangular shape, for example, a right-angled triangular shape, at the lower point of the recesses Pd4, Pe4, and Pf4. The low point of the concave portions Pd4, Pe4, and Pf4 may correspond to an edge portion outside of the exit surface of the light emitting device 105. The convex portions Pd3, Pe3, and Pf3 may provide an inclined surface between adjacent light emitting devices 105, and a portion corresponding to the low point of the concave portions Pd4, Pe4, and Pf4 may be provided in a perpendicular surface to the low point. FIG. 23 shows a flat surface with the inclined surface of the convex portion Pd3, the high point portion of the convex portion Pd3 shows an angled surface, and FIG. 24 shows a high point portion of the convex portion Ped3 having a curved surface, and FIG. 25 may show to arrange as a micro lens on the inclined surface of the convex portion Pf3. In FIGS. 23 to 25, since light is transmitted along the inclined directions of the convex portions Pd3, Pe3, and Pf3, the distribution of the equiluminance curve around the light emitting device 105 may be formed long along the inclined direction.

Figure 26:
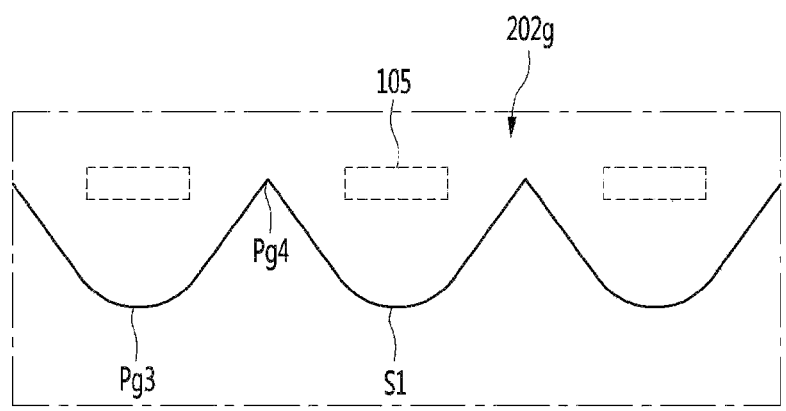
Figure 27:
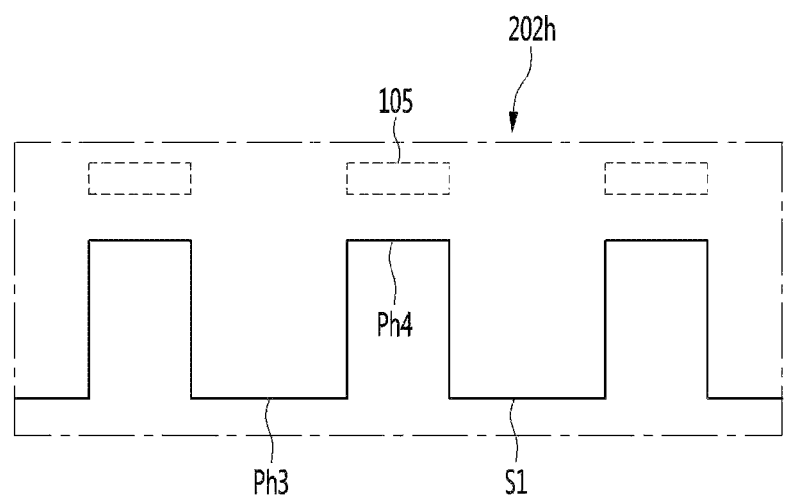
Figure 28:
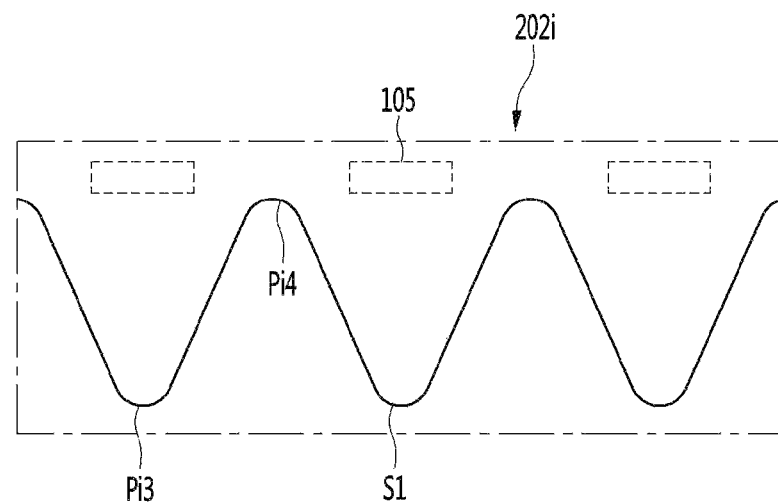

FIGS. 26 to 28 are other examples of lighting modules.

Referring to FIG. 26, the lighting module 202g has convex portions Pg3 and concave portions Pg4 alternately arranged on the front side surface S1, and the convex portions Pg3 overlap the light emitting devices 105 and has a curved surface, and the concave portion Pg4 has a low point located between the light emitting devices 105. In such a structure, it is possible to provide a wide distribution of the equiluminance curve.

Referring to FIG. 27, the lighting module 202h has a convex portion Ph3 and a concave portion Ph4 alternately arranged on the front side surface S1, and the concave portion Ph4 has a polygonal shape and corresponds to the light emitting device 105, and the convex portion Ph3 may protrude in a region between the light emitting devices 105. In such a structure, it is possible to provide a wide distribution of the equiluminance curve.

Referring to FIG. 28, the lighting module 202i has convex portions Pi3 and concave portions Pi4 alternately arranged on the front side surface S1, and the convex portions Pi3 is disposed to correspond to the light emitting devices 105. The concave portion Pi3 may correspond to a region between the light emitting devices 105. The convex portion Pi3 and the concave portion Pi4 may have a curved surface and be provided in a sine wave shape. In such a structure, it is possible to provide a wide distribution of the equiluminance curve.

Figure 29:
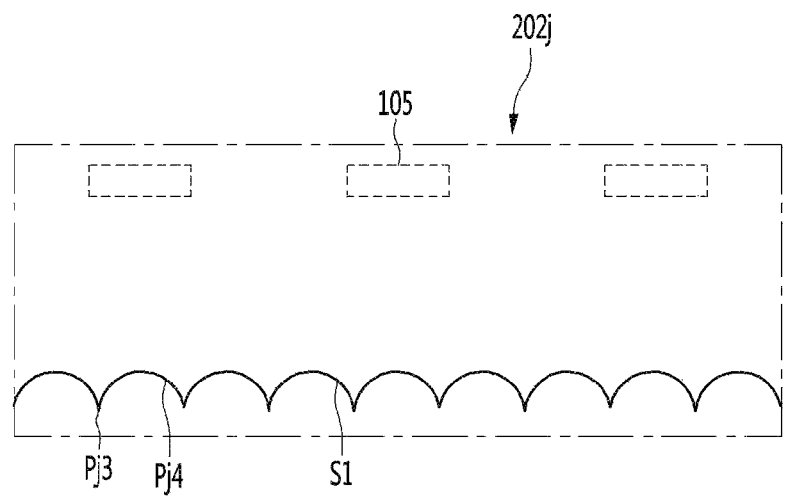

Referring to FIG. 29, the lighting module 202j has convex portions Pj3 and concave portions Pj4 alternately arranged on the front side surface S1, and the convex portions Pj3 have convex curved surfaces and may be smaller than the width of a concave curved surface of concave portion Pj4 or radius of curvature of the concave curved surface of Pj4. One or more of the concave portions Pj4 may be disposed to correspond to the light emitting device 105, and thus provided in the form of a concave micro-lens, thereby providing a wide distribution of the equiluminance curve.

Figure 30:
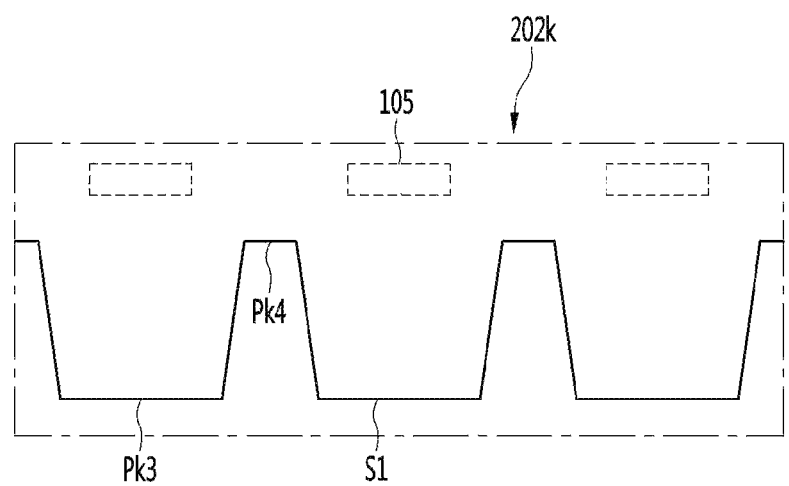

Referring to FIG. 30, the lighting module 202k is provided with a convex portion Pk3 and a concave portion Pk4 alternately arranged on the front side surface S1, and the convex portion Pk3 is provided on a flat surface and correspond to the light emitting device 105, the concave portion Pk4 may correspond to a region between the light emitting devices 105 and has a trapezoidal shape. The width of the concave portion Pk4 may be gradually narrowed as the depth increases. Since the concave portion Pk4 is provided with an inclined side surface, it is possible to refract the incident light.

Figure 31:
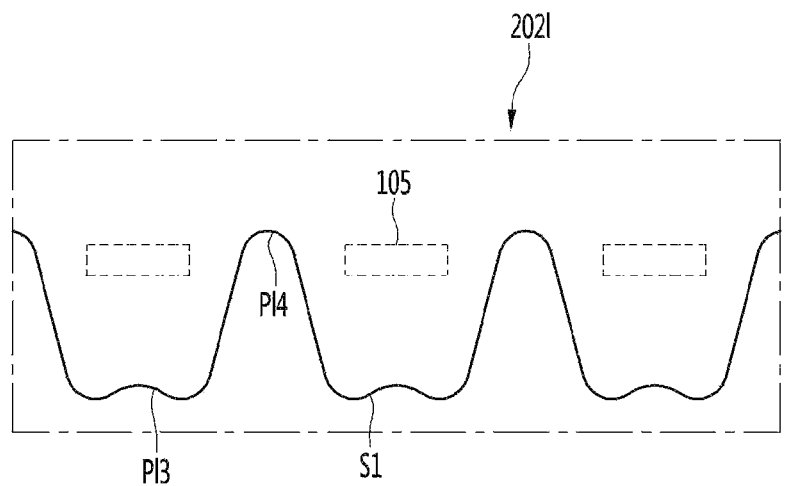

Referring to FIG. 31, the lighting module 202l may be provided differently from the structure of FIG. 20. The lighting module 202l has a structure in which the depth of the concave portion Pl4 between the convex portions Pl3 is deeper, and the low point of the concave portion Pl4 may be disposed deeper than a rear side surfaces of the light emitting devices 105. In this case, some light traveling toward the rear side surface of the light emitting device 105 may be refracted and extracted to the front side surface S1.

Figure 32:
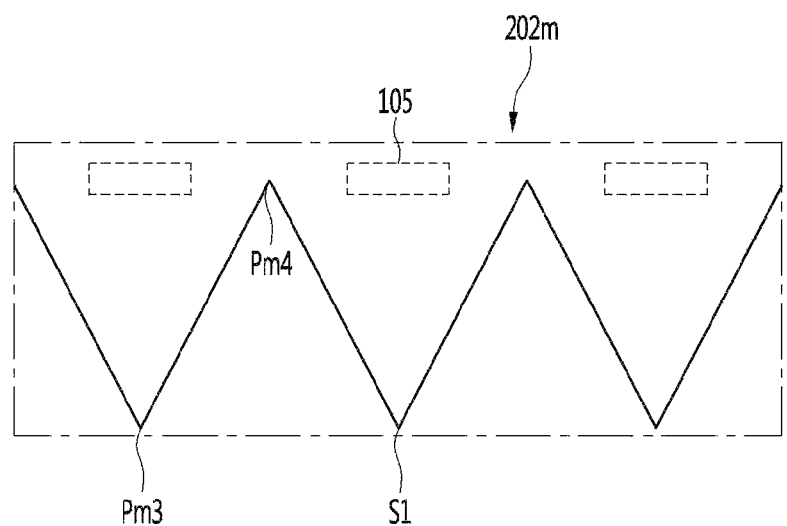
Figure 33:
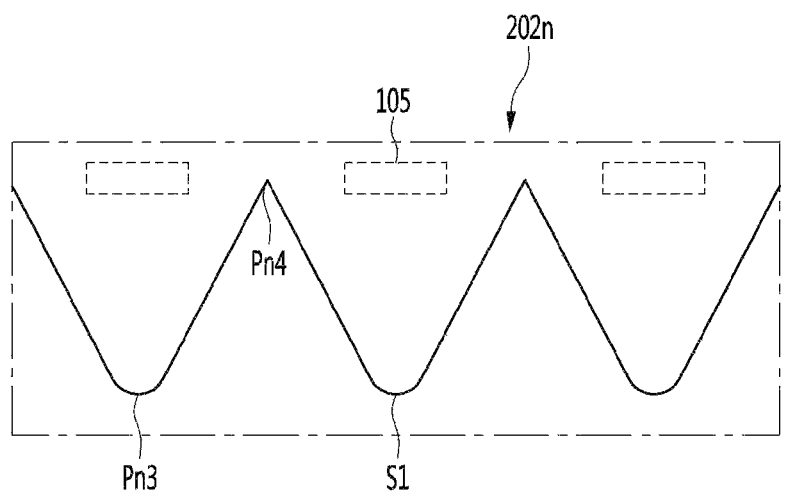
Figure 34:
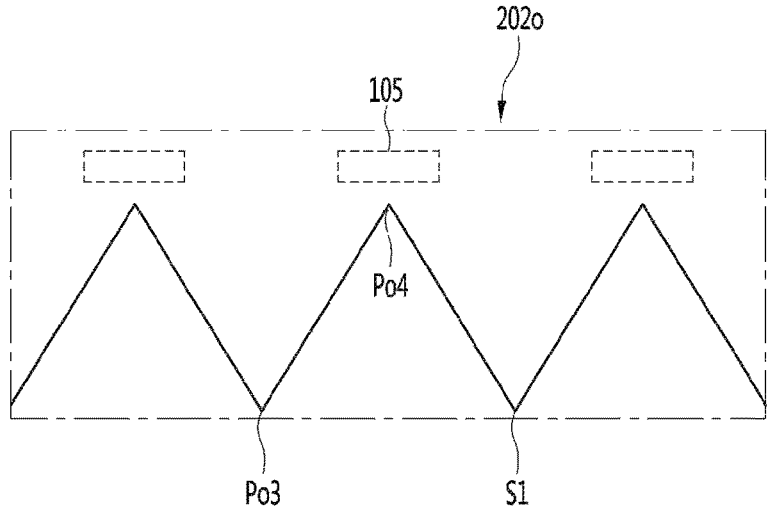

In FIGS. 32 to 34, the lighting modules 202m, 202n, and 202o are arranged in convex portions Pm3, Pn3, Po3 having a triangular shape and concave portions Pm4, Pn4, Po4 having a triangular shape, and FIG. 32 is located between concave portions Pm4 between the light emitting devices 105, the high point portion of the convex portion Pm3 may be formed in an angled surface to correspond to the center of the light emitting device 105, and FIG. 33 shows a curved surface formed such that the high point of a convex portion Pn4 in FIG. 32 corresponds to the center of the light emitting device 105, and FIG. 34 shows an angled surface or curved surface formed such that the low point of the concave portion Po4 corresponds to the center of the light emitting device 105. The high point of the convex portion Po3 corresponds to the region between the light emitting devices 105 and may be an angled surface or a curved surface. In the structures as shown in FIGS. 32 and 34, the distribution of the equiluminance curve may be widened, and in the case of FIG. 33, the luminous intensity may be improved.

Figure 35:
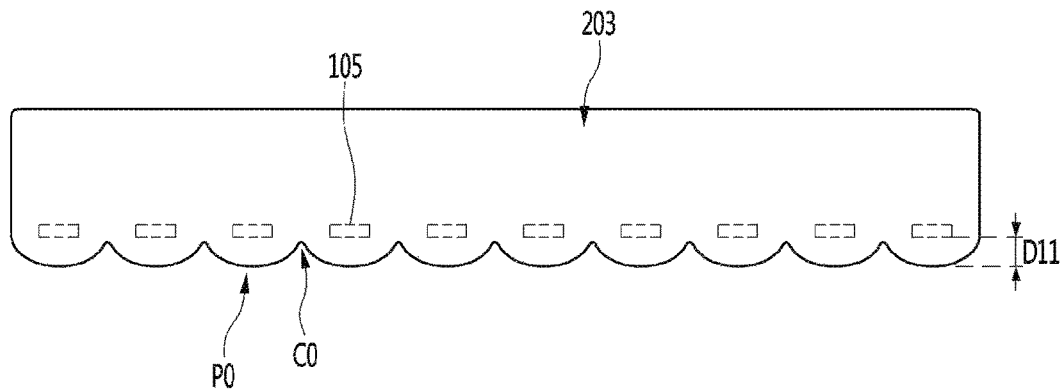
FIG. 35 and FIG. 36 are examples of modifying the distance between the light emitting device and the front side surface in the lighting module according to the embodiment of the invention.
Figure 36:
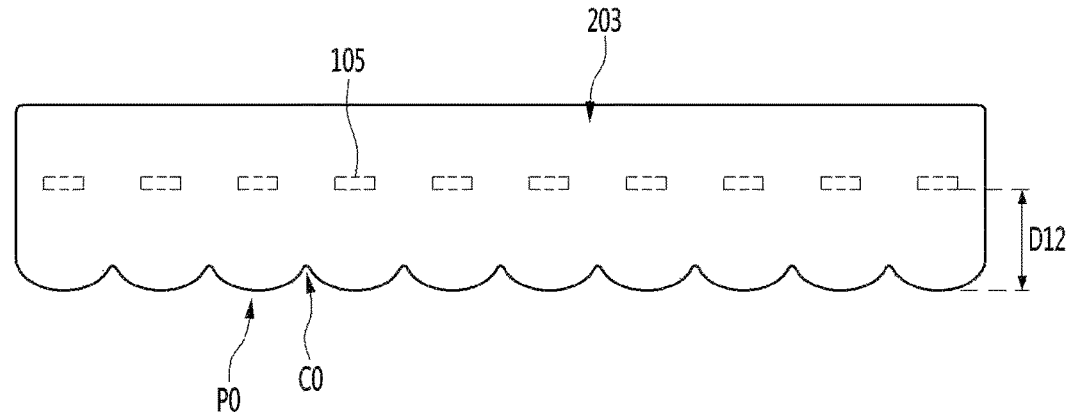

FIGS. 35 and 36 show a case in which the distances D11 and D12 between the high point of the light emitting device 105 and the convex portion in the lighting module of the invention are different from those of FIG. 4. In this case, the convex portion P0 and the concave portion C0 may have the curvature disclosed in FIG. 4.

The lighting module 203 of FIG. 35 is a case in which the distance D11 between the high point of the light emitting device 105 and the convex portion P0 is 4 to 6 mm, and a distance D12 between the light emitting device 105 and the high point of the convex portion P0 in FIG. 36 ranges of 13 mm to 21 mm, the luminous intensity in the horizontal and vertical directions is high rather than the structure of FIG. 35, but the luminous intensity may be low. In the structure of FIG. 35, a light spot may be short, so hot spots may be generated.

In addition, according to an embodiment of the invention, when the thickness of the resin layer 220 is thick, for example, when the thickness of the resin layer 220 is provided, the light emitting area is increased due to an increase in the thickness of the resin layer 220, thereby improving light distribution.

Figure 39:
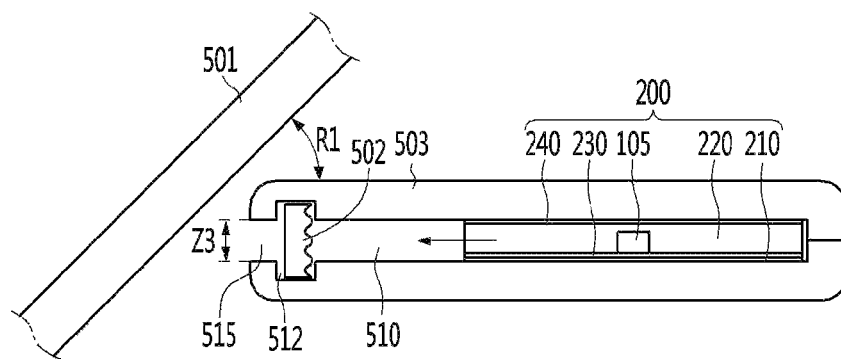
FIG. 39 is an example of a lamp to which a lighting module is applied according to an embodiment of the invention.

Lighting module according to an embodiment of the invention may be applied to the lamp as shown in FIG. 39. The lamp is an example of a vehicle lamp, such as a head lamp, a car width lamp, a side mirror light, a fog light, a tail lamp, a brake light, a daytime running light, a vehicle interior light, a door scar, a rear combination lamp, or applicable to backup lamps.

Referring to FIG. 39, the lamp may be coupled to the lighting module 200 disclosed above inside the housing 503 having an inner lens 502. The thickness of the lighting module 200 is such that it may be inserted into the inner width of the housing 503. The width Z3 of the exit portion 515 of the inner lens 502 may be equal to or less than twice the thickness of the lighting module 200, and thus, it is possible to prevent a decrease in the luminous intensity.

The inner lens 502 may be spaced a predetermined distance, for example, 10 mm or more from the front side surface of the lighting module 200. An outer lens 501 may be disposed on the exit side surface of the inner lens 502. The lamp having the lighting module 200 is an example, and may be applied in a structure having ductility to other lamps, for example, a curved or curved structure when viewed from the side surface.

Figure 40:
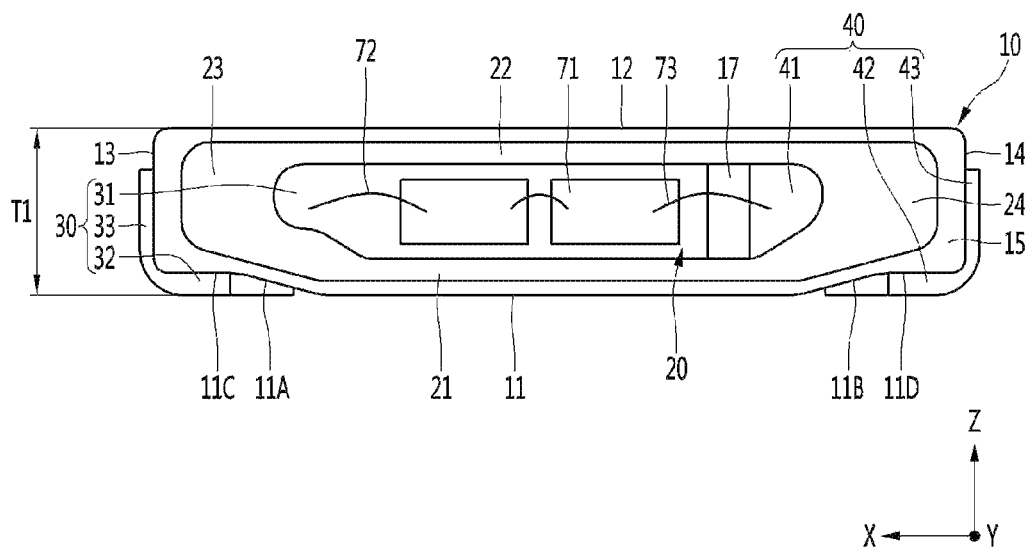
FIG. 40 is an example of a front view of a light emitting device applied to the lighting module of the embodiment of the invention.
Figure 41:
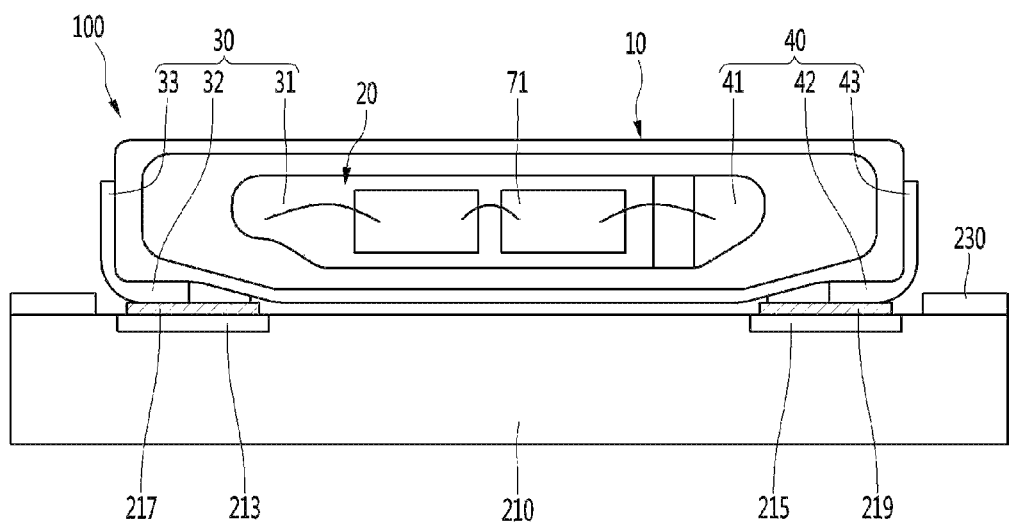
FIG. 41 is an example of a module in which the light emitting device of FIG. 40 is disposed on a circuit board.
Figure 42:
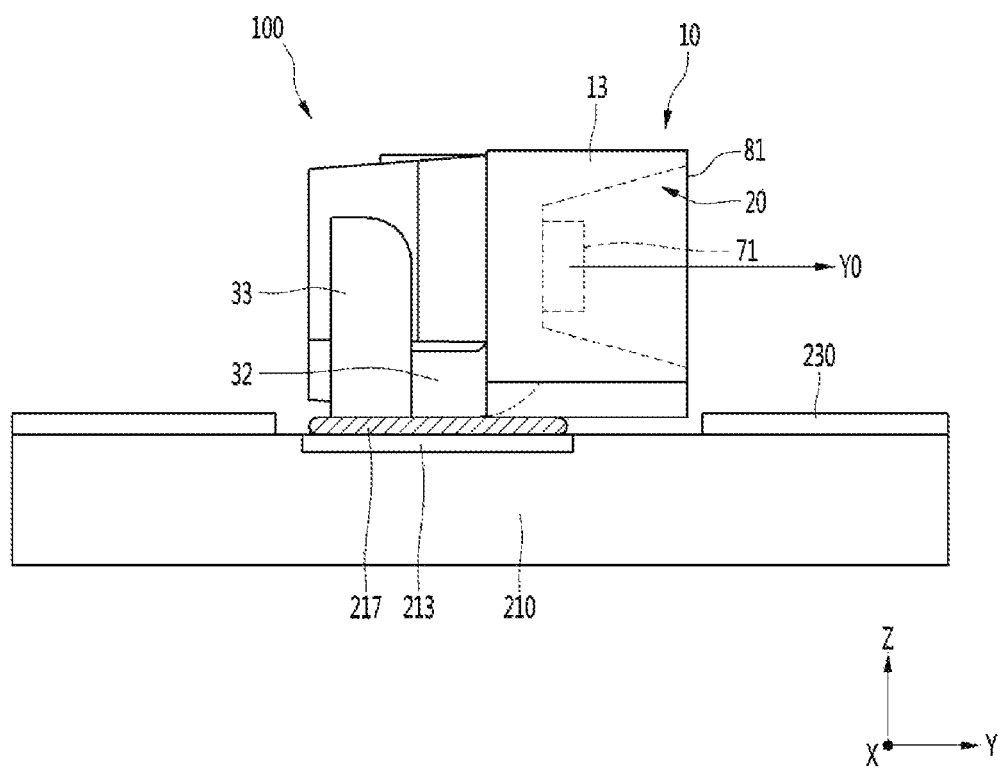
FIG. 42 is a view of the module of FIG. 41 as viewed from the other side.

FIG. 40 is a plan view showing an example of a light emitting device applied to a lighting module according to an embodiment of the invention, FIG. 41 is an example of a module in which the light emitting device of FIG. 40 is disposed on a circuit board, and FIG. 42 is another side surface of FIG. 41 as viewed from the other side.

Referring to FIG. 40, the light emitting device 100 includes a body 10 having a cavity 20, a plurality of lead frames 30 and 40 in the cavity 20, and one or a plurality of light emitting chips 71 disposed on at least one of the plurality of lead frames 30 and 40. The light emitting device 100 is an example of the light emitting device disclosed in the above embodiment and may be implemented as a side-view type light emitting package.

The light emitting device 100 may have a length in the first direction of three times or more, for example, four times or more than the width of the second direction. The length of the first direction may be 2.5 mm or more, for example, in a range of 2.7 mm to 4.5 mm. The light emitting device 100 may provide a long length in the first direction, thereby reducing the number of light emitting devices 100 in the first direction. The light emitting device 100 may provide a relatively thin thickness, thereby reducing the thickness of the lighting module having the light emitting device 100. The thickness of the light emitting device 100 may be 2 mm or less. The body 10 is provided with the cavity 20 and the length of the body 10 in the first direction may be three times or more compared to the thickness T1 of the body 10, thereby widening the angle of beam spread of light in the first direction.

The lead frames 30 and 40 are disposed on the bottom of the cavity 20 of the body 10. For example, a first lead frame 30 and a second lead frame 40 are coupled to the body 10.

The body 10 may be formed of an insulating material. The body 10 may be formed of a reflective material. The body 10 may be formed of a material having a reflectance higher than a transmittance with respect to a wavelength emitted from the light emitting chip 71, for example, a material having a reflectance of 70% or more. In the case in which the reflectance is 70% or more, the body 10 may be defined as a non-transparent material or a reflective material. The body 10 may be formed of a resin-based insulating material, for example, a resin material such as Polyphthalamide (PPA). The body 10 may be formed of a thermosetting resin including a silicone-based, epoxy-based, or plastic material, or a material having high heat resistance and high light resistance. The body 10 includes a white-based resin. In the body 10, an acid anhydride, an antioxidant, a release agent, a light reflector, inorganic filler, a curing catalyst, a light stabilizer, a lubricant, and titanium dioxide may be selectively added. The body 10 may be formed of at least one selected from the group consisting of an epoxy resin, a modified epoxy resin, a silicone resin, a modified silicone resin, an acrylic resin, and a urethane resin. For example, an epoxy resin composed of triglycidyl isocyanurate, hydrogenated bisphenol A diglycidyl ether, etc. and an acid anhydride composed of hexahydrophthalic anhydride, 3-methylhexahydrophthalic anhydride, 4-methylhexahydrophthalic anhydride, etc. are added with 1,8-diazabicyclo (5,4,0) undecene-7 (DBU) as a curing agent, ethylene glycol as a co-catalyst, titanium oxide pigment, and glass fiber in the epoxy resin, and thus, a solid epoxy resin composition which is partially cured by heating and B stated may be used but the present invention is not limited thereto. The body 10 may be formed by suitably mixing at least one selected from the group consisting of a dispersant, a pigment, a fluorescent material, a reflective material, a light shielding material, a light stabilizer, and a lubricant in a thermosetting resin.

The body 10 may include a reflective material, such as a resin material in which a metal oxide is added, and the metal oxide may include at least one of $TiO_2$, $SiO_2$, and $Al_2O_3$. Such a body 10 may effectively reflect incident light. As another example, the body 10 may be formed of a resin material having a translucent resin material or a phosphor material converting a wavelength of incident light.

The front portion 15 of the body 10 may be a surface on which the cavity 20 is disposed, or may be a surface on which light is emitted. The rear portion of the body 10 may be an opposite side of the front portion 15.

The first lead frame 30 includes a first lead portion 31 disposed at the bottom of the cavity 20, a first bonding portion 32 disposed on a first outer regions 11A and 11C of the first side portion 11 of the body 10, and a first heat radiating portion 33 disposed on the third side portion 13 of the body 10. The first bonding portion 32 is bent from the first lead portion 31 disposed in the body 10 and protrudes to the first side portion 11, and the first heat radiating portion 33 may be bent from the first bonding portion 32. The first outer regions 11A and 11C of the first side portion 11 may be a region adjacent to the third side portion 13 of the body 10.

The second lead frame 40 includes a second lead portion 41 disposed on the bottom of the cavity 20, a second bonding portion 42 disposed on second outer regions 11B and 11D of the first side portion 11 of the body 10, and a second heat radiating portion 43 disposed on the fourth side portion 14 of the body 10. The second bonding portion 42 is bent from the second lead portion 41 disposed in the body 10 and the second heat radiating portion 43 may be bent from the second bonding portion 42. The second outer regions 11B and 11D of the first side portion 11 may be a region adjacent to the fourth side portion 14 of the body 10.

A gap portion 17 between the first and second lead portions 31 and 41 may be formed of a material of the body 10 and may be the same horizontal surface with the bottom of the cavity 20 or may protrude, but the invention is not limited thereto. The first outer regions 11A and 11C and the second outer regions 11B and 11D has an inclined regions 11A and 11B and a flat regions 11C and 11D. The first and second bonding portions 32 and 42 of the first and second lead frames 30 and 40 may protrude through the inclined regions 11A and 11B, but the invention is not limited thereto.

Here, the light emitting chip 71 may be disposed on, for example, the first lead portion 31 of the first lead frame 30. The light emitting chip 71 may be connected to the first and second lead parts 31 and 41 by wires 72 and 73, or the light emitting chip 71 may be adhesively connected to the first lead part 31 and connected to the second lead part 41 by wire. The light emitting chip 71 may be a horizontal chip, a vertical chip, or a chip having a via-structure. The light emitting chip 71 may be mounted in a flip chip manner. The light emitting chip 71 may selectively emit light within a wavelength range of an ultraviolet ray to a visible ray. The light emitting chip 71 may emit ultraviolet light or a blue peak wavelength, for example. The light emitting chip 71 may include at least one of Group II-VI compounds and Group III-V compounds. The light emitting chip 71 may be formed of a compound selected from the group consisting of GaN, AlGaN, InGaN, AlInGaN, GaP, AlN, GaAs, AlGaAs, InP and mixtures thereof. The light emitting chip 71 may be disposed in the cavity 20 in one or more. The plurality of light emitting chips 71 may be disposed on at least one of the first lead frame 30 and the second lead frame 40.

In an inner side of the cavity 20, first, second, third and fourth inner sides 21, 22, 23 and 24 disposed around the cavity 20 may be inclined with respect to a horizontal straight line of an upper surface of the lead frames 30 and 40. A first inner side 21 adjacent to the first side portion 11 and a second inner side 22 adjacent to the second side portion 12 is inclined at an angle to the bottom of the cavity 20, and a third inner side 23 adjacent to the third side portion 13 and a fourth inner side 24 adjacent to the fourth side portion 14 may be inclined at an angle smaller than the inclination angle of the first and second inner sides 21 and 22. Accordingly, the first and second inner sides 21 and 22 reflect the progress of the incident light toward the first axis direction Y, and the third and fourth inner sides 23 and 24 may diffuse the incident light in the second axis direction X.

The inner side surfaces 21, 22, 23 and 24 of the cavity 20 may have a stepped region vertically stepped from the front side portion 15 of the body 10. The stepped region may be disposed to be stepped between the front side portion 15 of the body 10 and the inner sides 21, 22, 23 and 24. The stepped region may control the directivity characteristic of the light emitted through the cavity 20.

The light emitting chip 71 disposed in the cavity 20 of the light emitting device 100 according to the embodiment may be arranged in one or a plurality. The light emitting chip 71 may be selected from, for example, a red LED chip, a blue LED chip, a green LED chip, and a yellow green LED chip.

A molding member 81 is disposed in the cavity 20 of the body 11 as shown in FIG. 42, and the molding member 81 includes a light-transmitting resin such as silicone or epoxy, and may be formed in a single layer or multiple layers. A phosphor for changing a wavelength of light emitted on the molding member 81 or the light emitting chip 71 may be included, and the phosphor excites and emits a portion of the light emitted from the light emitting chip 71 to obtain a different wavelength. The phosphor may be selectively formed from quantum dots, YAG, TAG, Silicate, Nitride, and Oxy-nitride-based materials. The phosphor may include at least one of a red phosphor, a yellow phosphor, and a green phosphor, but is not limited thereto. The surface of the molding member 81 may be formed in a flat shape, a concave shape, a convex shape, etc., but is not limited thereto. As another example, a light-transmitting film having a phosphor may be disposed on the cavity 20, but is not limited thereto.

A lens may be further formed on the upper portion of the body 10, and the lens may include a concave or convex lens structure, and may control light distribution of light emitted by the light emitting device 100.

A semiconductor device such as a light receiving device or a protection device may be mounted on the body 10 or any one of the lead frames, and the protection device may be implemented as a thyristor, a Zener diode, or a TVS (Transient Voltage Suppression), and the Zener diode protects the light emitting chip 71 from electrostatic discharge (ESD).

Referring to FIGS. 41 and 42, at least one or a plurality of light emitting devices 100 are disposed on a substrate 210, and a first reflective layer 230 is disposed around a lower portion of the light emitting devices 100. The light emitting device 100 may be applied to the lighting module disclosed above as an example of the light emitting device disclosed in the embodiment.

The first and second lead portions 33 and 43 of the light emitting device 100 are bonded to the electrode patterns 213 and 215 of the substrate 210 with solder or conductive tape, which are conductive adhesive members 217 and 219.

The characteristics, structures and effects described in the above-described embodiments are included in at least one embodiment but are not limited to one embodiment. Furthermore, the characteristic, structure, and effect illustrated in each embodiment may be combined or modified for other embodiments by a person skilled in the art. Thus, it would be construed that contents related to such a combination and such a modified example are included in the scope of the invention.

In addition, embodiments are mostly described above. However, they are only examples and do not limit the invention. A person skilled in the art may appreciate that several variations and applications not presented above may be made without departing from the essential characteristics of the embodiments. For example, each component particularly represented in the embodiments may be varied. In addition, it should be construed that differences related to such a variation and such an application are included in the scope of the invention defined in the following claims.

An embodiment of the invention provides a lighting module that irradiates light emitted from a plurality of light emitting devices with a light source having a line shape or a surface light source.

An embodiment of the invention provides a lighting module in which a resin layer having a light emitting device is disposed between plurality of reflective layers.

An embodiment of the invention provides a lighting module for irradiating a side light source having a line shape or a surface light source and a lighting apparatus having the same.

An embodiment of the invention may provide a light unit having a lighting module, a liquid crystal display device, and a vehicle lamp.

A lighting module according to an embodiment of the invention comprises: a substrate; a light emitting device disposed on the substrate; a first reflective layer disposed on the substrate; a resin layer disposed on the first reflective layer; and a second reflective layer disposed on the resin layer, wherein the resin layer includes a front side surface through which light generated from the light emitting device is emitted, and the front side surface of the resin layer may include a plurality of convex portions and a plurality of concave portions.

According to an embodiment of the invention, a plurality of light emitting devices are disposed on the substrate, the resin layer is disposed to surround the light emitting device, and the resin layer include a rear side surface facing the front side surface, and a first side surface and a second side surface opposite to each other and connecting the front side surface and the rear side surface, wherein a distance between the first reflective layer and the second reflective layer is less than a distance between the front side surface and the rear side surface of the resin layer, the convex portion of the front side surface may be protruded convexly toward the front side surface from the light emitting device, and the concave portion of the front side surface may be recessed in a direction of the rear side surface between the plurality of convex portions.

According to an embodiment of the invention, the first reflective layer may have a hole which the plurality of light emitting devices are penetrated.

According to an embodiment of the invention, the distance between the first and second side surfaces of the resin layer may be greater than the distance between the high point of the convex portion and the rear side surface.

According to an embodiment of the invention, the front side surface, the rear side surface, the first side surface, and the second side surface of the resin layer are surfaces between the first and second reflective layers, and the resin layer emits light having a constant height through the front side surface.

According to an embodiment of the invention, the convex portion may include a lens portion having a curved surface convex in a direction of the front side surface of the resin layer.

According to an embodiment of the invention, the lens portion have a maximum distance from the light emitting device as the region facing the center of the light emitting device.

According to an embodiment of the invention, the thickness of the lens portion may be an interval between the first and second reflective layers or the thickness of the resin layer.

According to an embodiment of the invention, the thickness of the resin layer may be 2 times or less of the thickness of the light emitting device.

According to an embodiment of the invention, each of the plurality of convex portions faces to each of the plurality of light emitting devices, the concave portion faces to a region between the plurality of light emitting devices, and an exit surface of the light emitting device may be disposed to face the convex portion.

According to an embodiment of the invention, the plurality of convex portions include first and second convex portions, and the plurality of light emitting devices include first and second light emitting devices arranged in a first direction, and in a second direction toward the front side surface from the rear side surface of the resin layer, the first convex portion may overlap the first light emitting device and the second convex portion may overlap the second light emitting device.

According to an embodiment of the invention, the concave portion has a concave curved surface in a direction of the rear side surface between the first and second convex portions and may correspond to a region between the first and second light emitting devices.

According to an embodiment of the invention, light emitted from the plurality of light emitting devices is totally reflected by the first and second reflective layers, and may be emitted through the front side surface.

According to an embodiment of the invention, the first and second reflective layers may have a shape corresponding to a shape of the convex portion and the concave portion disposed on the front side surface of the resin layer.

According to an embodiment of the invention, the substrate may have a shape corresponding to the shape of the convex portion and the concave portion disposed on the front side surface of the resin layer.

According to an embodiment of the invention, comprising a third reflective layer disposed on the rear side surface, the first side surface and the second side surface of the resin layer may include.

According to an embodiment of the invention, the number of convex portions of the resin layer may be the same as the number of the light emitting devices.

According to an embodiment of the invention, the first reflective layer may contact the lower surface of the resin layer, and the second reflective layer may contact the upper surface of the resin layer.

A lighting module according to an embodiment of the invention comprises: a substrate; a plurality of light emitting devices disposed on the substrate; a first reflective layer disposed on the substrate; a resin layer disposed on the first reflective layer; and a second reflective layer disposed on the resin layer, wherein the resin layer includes a front side surface through which light generated from the plurality of light emitting devices is emitted, and the front side surface of the resin layer includes a plurality of convex portions and a plurality of concave portions. The plurality of convex portions and the plurality of concave portions have the same height, and the plurality of light emitting devices include a first light emitting device, a second light emitting device and a third light emitting device disposed between the first light emitting device and the second light emitting device, and the plurality of convex portions may include a first convex portion facing the first light emitting device, a second convex portion facing the second light emitting device, and a third a third convex portion facing the third light emitting device.

According to an embodiment of the invention, the luminous intensity of the light source may improve.

According to an embodiment of the invention, a surface light source having a line shape may provide.

According to an embodiment of the invention, it is possible to reduce the process of the lighting module.

According to an embodiment of the invention, light efficiency may be improved by reducing light loss.

According to an exemplary embodiment of the invention, since a light module of a thin thickness is provided in the form of a line light source, design freedom may be increased.

According to an embodiment of the invention, it is possible to improve the light uniformity of the surface light source.

It is possible to improve the optical reliability of the lighting module and the lighting device having the same according to an embodiment of the invention.

It is possible to improve the reliability of the lighting device for a vehicle having a lighting module according to an embodiment of the invention.

Embodiments of the invention may be applied to a light unit having a lighting module, various types of display devices, surface light source lighting devices, vehicle lamps.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A lighting module comprising:
   a substrate;
   a plurality of light emitting devices disposed on the substrate;
   a resin layer disposed on the substrate;
   a first reflective layer disposed on a bottom surface of the resin layer; and
   a second reflective layer disposed on a top surface of the resin layer,
   wherein the resin layer has a side surface facing an exit surface of at least one of the plurality of light emitting devices,
   wherein the side surface of the resin layer comprises a pattern including a plurality of convex portions and a plurality of concave portions, and
   wherein at least one of the first reflective layer and the second reflective layer comprises a pattern corresponding to the pattern of the resin layer.

2. The lighting module of claim 1, wherein at least of one of the plurality of convex portions of the resin layer has a radius of curvature greater than a radius of curvature of at least one of the plurality of concave portions.

3. The lighting module of claim 1, wherein the pattern of the at least one of the first reflective layer and the second reflective layer comprises a plurality of convex portions corresponding to a shape of the convex portion of the side surface and a plurality of concave portions corresponding to a shape of the concave portion of the side surface.

4. The lighting module of claim 1, wherein the pattern of the second reflective layer comprises a plurality of convex portions corresponding to a shape of the convex portion of the side surface and a plurality of concave portions corresponding to a shape of the concave portion of the side surface.

5. The lighting module of claim 4, wherein the pattern of the first reflective layer comprises a plurality of convex portions corresponding to a shape of the convex portion of the side surface and a plurality of concave portions corresponding to a shape of the concave portion of the side surface.

6. The lighting module of claim 1, wherein at least one of the plurality of convex portions has a convex curved surface.

7. The lighting module of claim 1, wherein at least one of the plurality of concave portions has a concave curved surface.

8. The lighting module of claim 1, wherein at least one of the plurality of convex portions has a thickness equal to a thickness of at least one of the plurality of concave portions in a vertical direction.

9. The lighting module of claim 1, wherein the plurality of convex portions has a same thickness from each other in a vertical direction.

10. The lighting module of claim 1, wherein at least one of the plurality of convex portions has a thickness equal to a thickness of the resin layer in a vertical direction.

11. A lighting module comprising:
    a substrate;
    a plurality of light emitting devices disposed on the substrate;
    a resin layer disposed on the substrate;
    a first reflective layer disposed on a bottom surface of the resin layer; and
    a second reflective layer disposed on a top surface of the resin layer,
    wherein the resin layer has a first side surface and a second side surface opposite to the first surface,
    wherein the first side surface of the resin layer comprises a first pattern including a plurality of convex portions and a plurality of concave portions,
    wherein the plurality of light emitting devices is disposed between the first reflective layer and the second reflective layer and is disposed between the first side surface and the second side surface,
    wherein at least one of the plurality of convex portions faces an exit surface of at least one of the plurality of light emitting devices, and
    wherein at least one of the first reflective layer and the second reflective layer comprises a second pattern corresponding to the pattern of the resin layer.

12. The lighting module of claim 11, wherein the plurality of concave portions is respectively disposed between the plurality of convex portions.

13. The lighting module of claim 11, wherein a maximum width of each of the plurality of convex portions in a first direction is a distance between adjacent concave portions, and is equal to or smaller than a pitch of the plurality of light emitting devices, and
    wherein the first direction is a direction in which the light emitting devices are arranged.

14. The lighting module of claim 11, wherein each of the plurality of convex portions of the resin layer has a radius of curvature greater than a radius of curvature of each the plurality of concave portions.

15. The lighting module of claim 11, wherein the pattern of the at least one of the first reflective layer and the second reflective layer comprises a plurality of convex portions corresponding to a shape of the convex portion of the side surface and a plurality of concave portions corresponding to a shape of the concave portion of the side surface.

16. The lighting module of claim 11, wherein at least one of the plurality of convex portions has a convex curved surface, and wherein at least one of the plurality of concave portions has a concave curved surface.

17. The lighting module of claim 16, wherein a radius of curvature of at least one of the convex portions is in a range of 8 mm to 14.

18. The lighting module of claim 16, wherein a radius of curvature of at least one of the concave portions is ⅛ times smaller than a radius of curvature of the convex portions.

19. The lighting module of claim 13, wherein the maximum width of each of the convex portions is in a range of 15 mm to 20 mm.

20. The lighting module of claim 11, wherein a maximum distance between at least one of the light emitting devices and the first side surface facing the exit surface of at least one of the plurality of light emitting devices, and wherein the maximum distance is in a range from 5 mm to 20 mm.

* * * * *